United States Patent [19]
Lee

[11] Patent Number: 5,785,796
[45] Date of Patent: Jul. 28, 1998

[54] VACUUM PROCESSING APPARATUS, VACUUM PROCESSING METHOD, AND METHOD FOR CLEANING THE VACUUM PROCESSING APPARATUS

[75] Inventor: Hideki Lee, Nirasaki, Japan

[73] Assignee: Tokyo Electron Limited, Tokyo, Japan

[21] Appl. No.: 773,094

[22] Filed: Dec. 24, 1996

Related U.S. Application Data

[63] Continuation of Ser. No. 255,950, Jun. 7, 1994, Pat. No. 5,616,208.

[30] Foreign Application Priority Data

| Sep. 17, 1993 | [JP] | Japan | 5-254680 |
| Sep. 17, 1993 | [JP] | Japan | 5-254681 |
| Sep. 17, 1993 | [JP] | Japan | 5-254682 |
| Sep. 20, 1993 | [JP] | Japan | 5-256506 |
| Sep. 20, 1993 | [JP] | Japan | 5-256507 |
| Sep. 20, 1993 | [JP] | Japan | 5-256508 |
| Nov. 1, 1993 | [JP] | Japan | 5-296148 |

[51] Int. Cl.$^6$ ............... C23F 1/02; C23C 16/00; C23C 14/56; B08B 7/00
[52] U.S. Cl. ............... 156/345; 118/715; 118/719; 204/298.25; 204/298.32; 204/298.33; 204/298.35; 134/1.1; 134/1.2; 134/1.3; 216/59; 216/63; 216/67; 438/905
[58] Field of Search .............. 204/298.25, 298.31, 204/298.32, 298.33, 298.35; 156/345, 626.1, 646.1; 216/59, 63, 67; 134/1.1, 1.2, 1.3, 2, 21, 22.1, 22.11; 118/715, 717, 723 MW, 723 ME, 723 MR, 723 MA, 723 E, 723 ER, 723 I, 723 IR; 438/905

[56] References Cited

U.S. PATENT DOCUMENTS

| 5,186,718 | 2/1993 | Tepman et al. | 118/719 |
| 5,254,176 | 10/1993 | Ibuka et al. | 134/2 |
| 5,286,296 | 2/1994 | Sato et al. | 118/719 |
| 5,308,431 | 5/1994 | Maher et al. | 156/345 |
| 5,380,370 | 1/1995 | Niino et al. | 134/22.11 |

*Primary Examiner*—R. Bruce Breneman
*Assistant Examiner*—Rodney G. McDonald
*Attorney, Agent, or Firm*—Oblon, Spivak, McClelland, Maier & Neustadt, P.C.

[57] ABSTRACT

A vacuum processing apparatus includes a plurality of vacuum processing chambers for processing a target object using a process gas, a vacuum convey chamber, connected to the plurality of vacuum processing chambers, for loading/unloading the target object into/from the processing chambers, an opening/closing means opened/closed to cause the plurality of vacuum processing chambers to communicate with the vacuum convey chamber, and a cleaning gas supply means for supplying a cleaning gas containing $ClF_3$ into at least one of the vacuum convey chamber and the plurality of vacuum processing chambers. The cleaning gas is supplied into the plurality of vacuum processing chambers and the vacuum convey chamber communicating with each other by opening the opening/closing means to clean the plurality of vacuum processing chambers and the vacuum convey chamber.

23 Claims, 16 Drawing Sheets

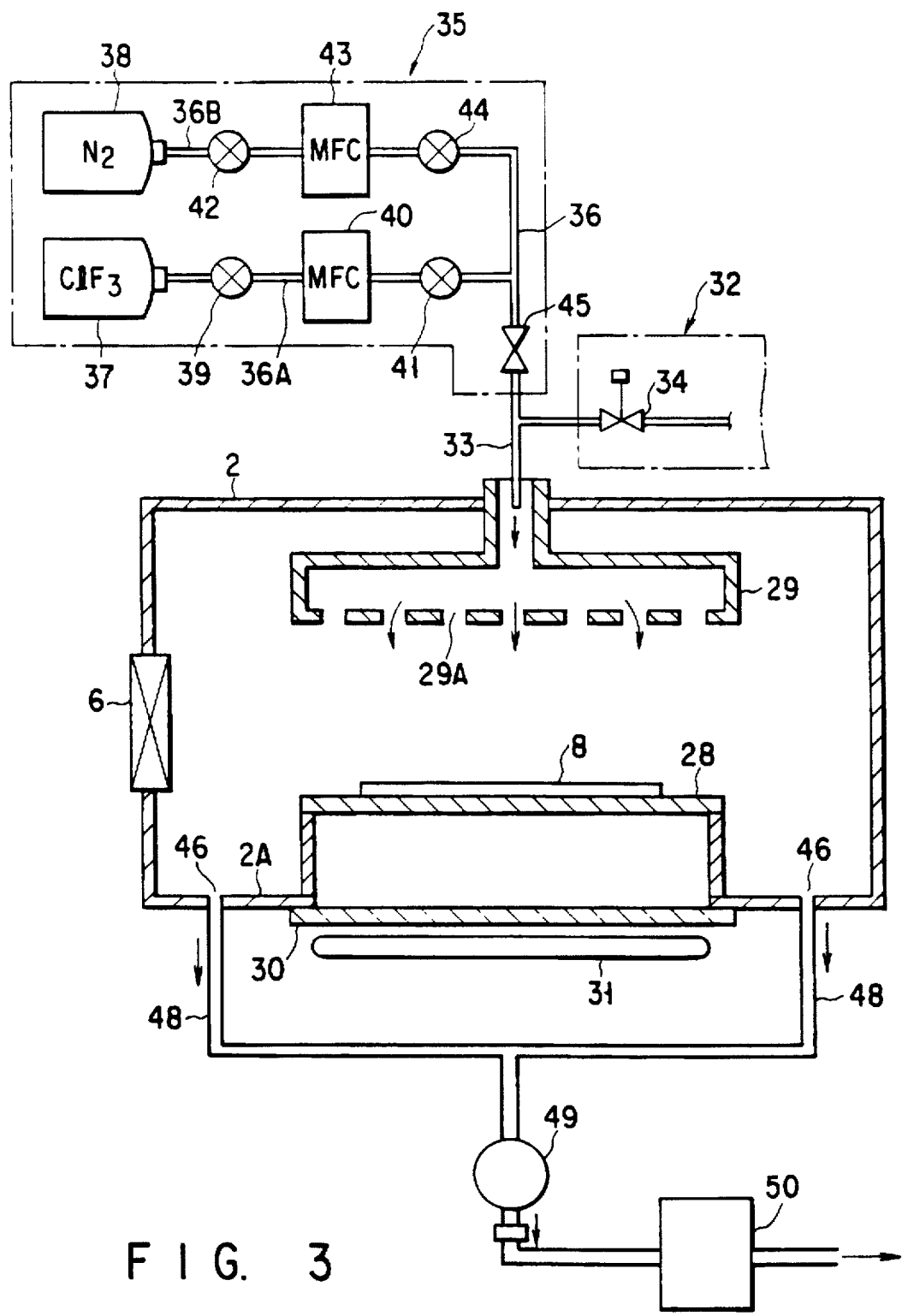
F I G. 3

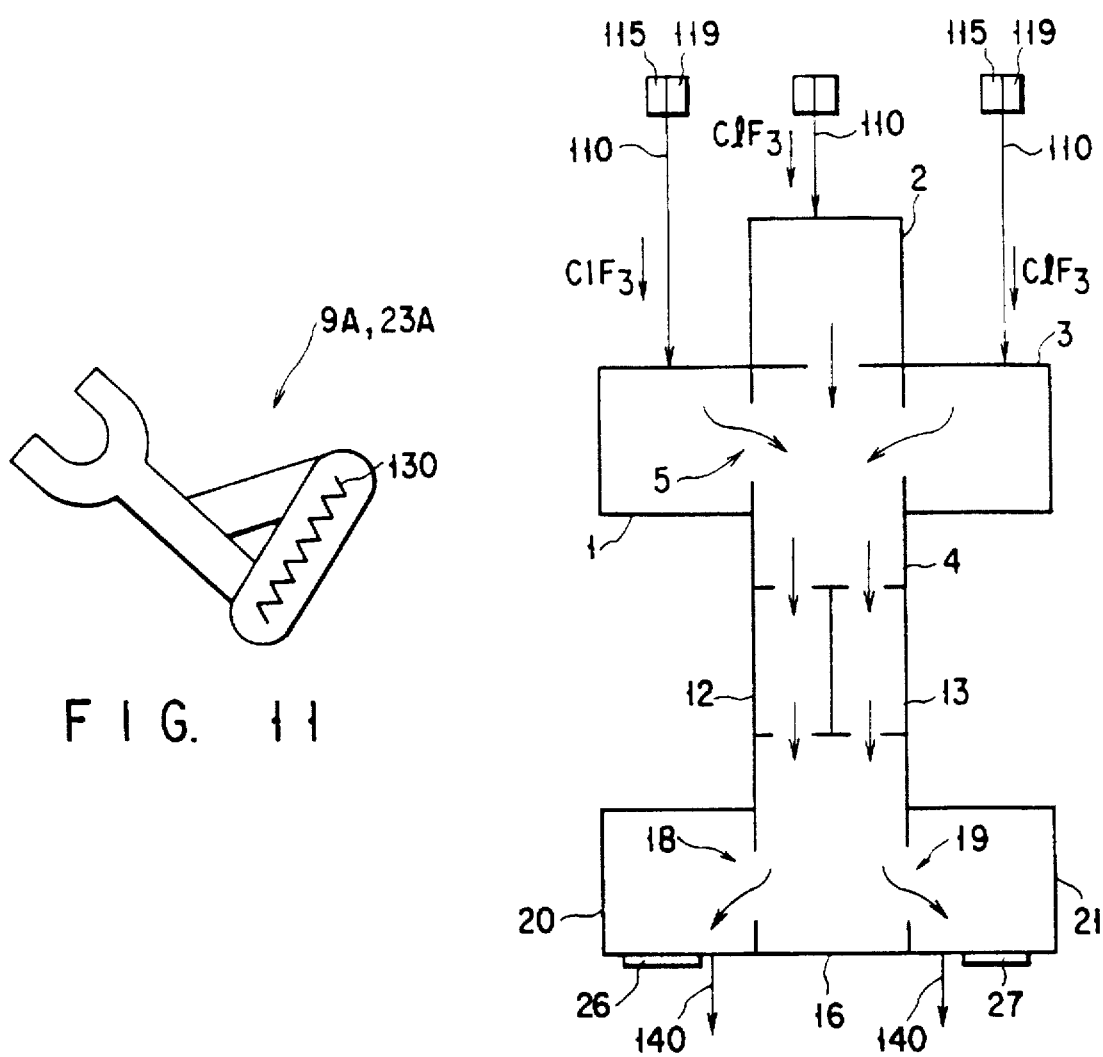
FIG. 11
FIG. 13
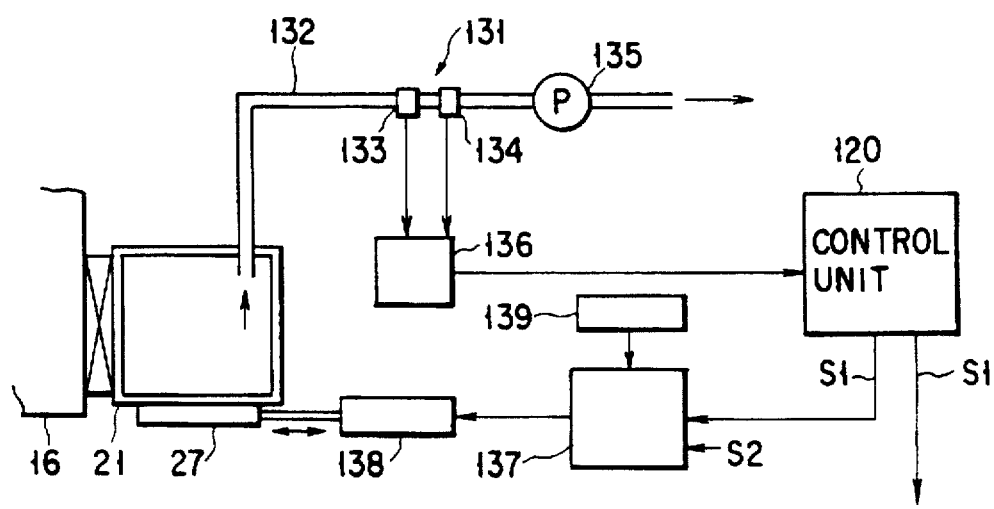
FIG. 12

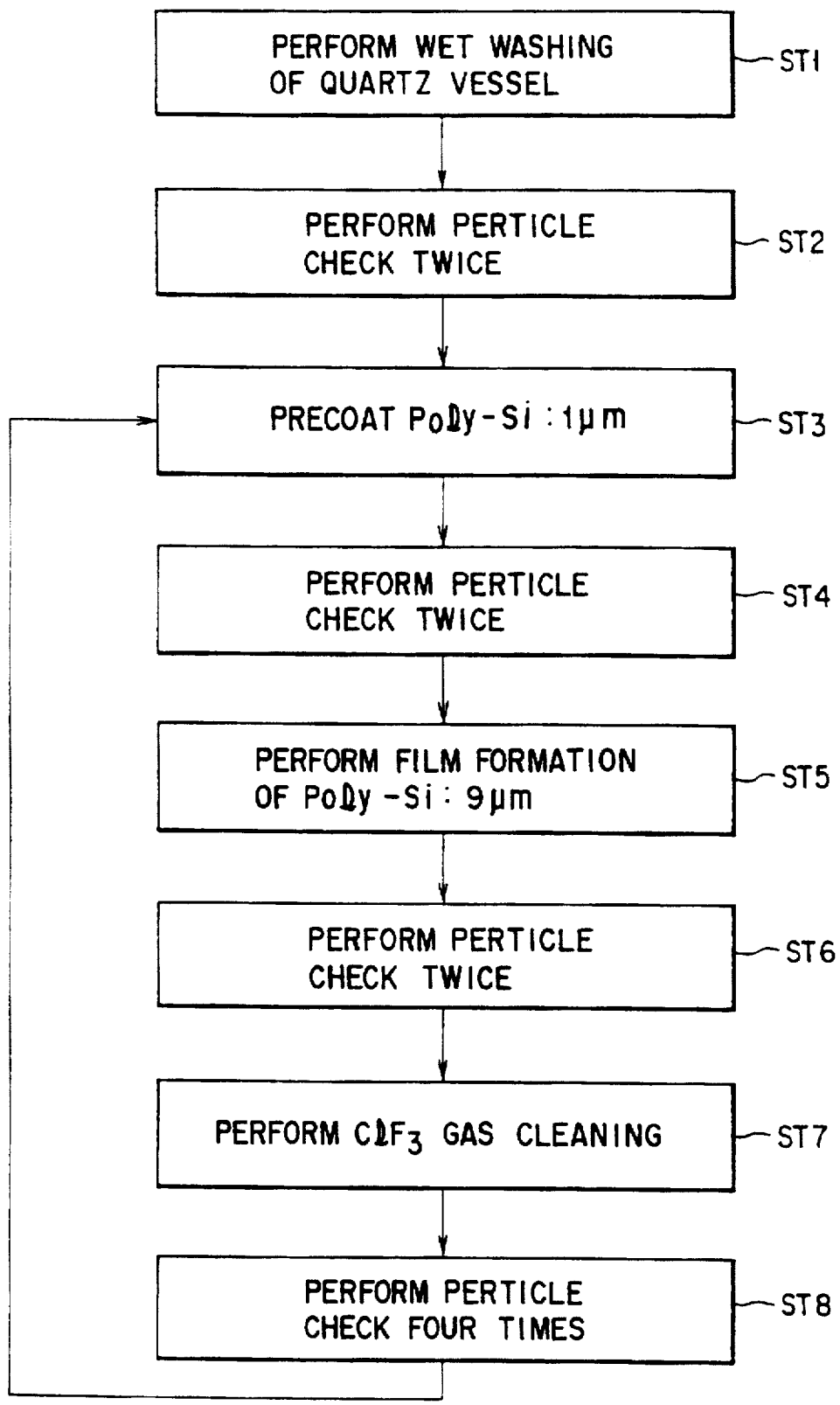
F I G. 20

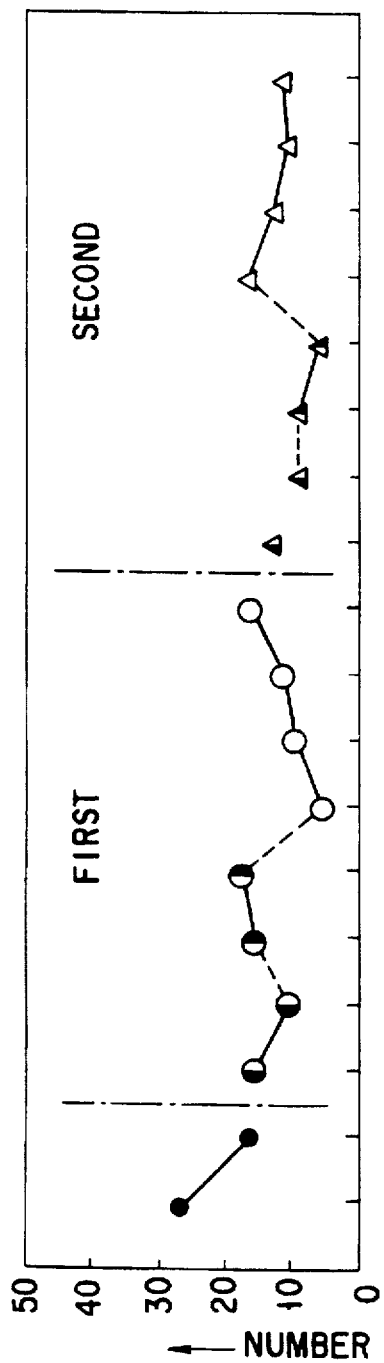
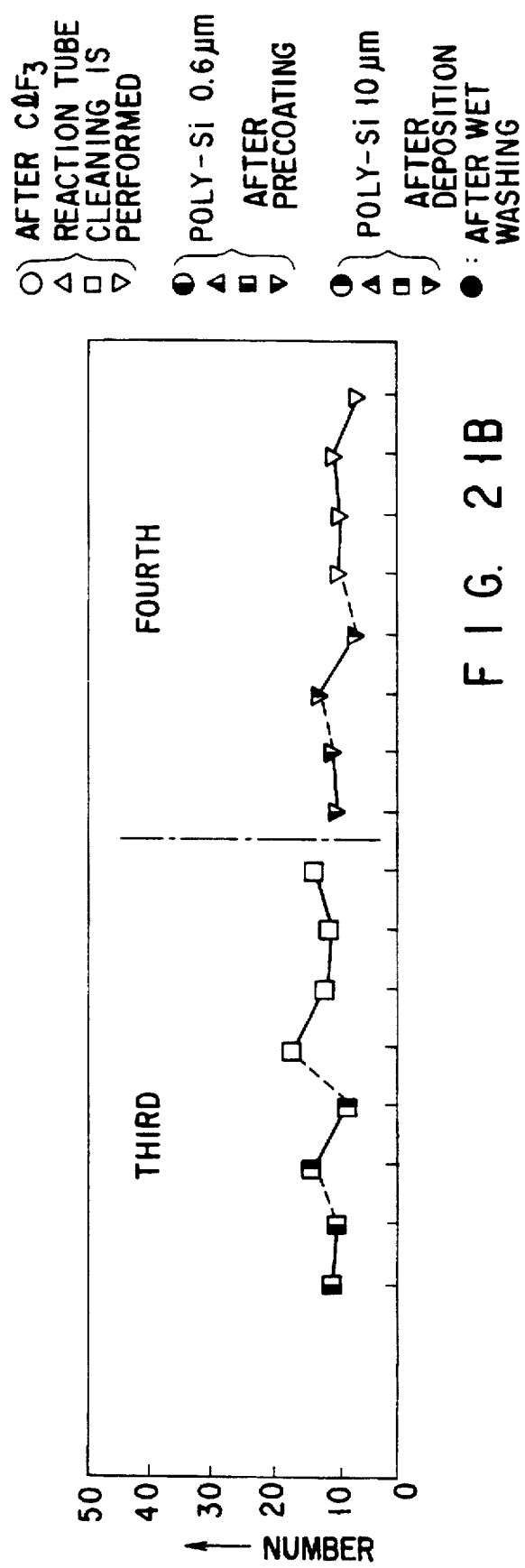
FIG. 21A
FIG. 21B

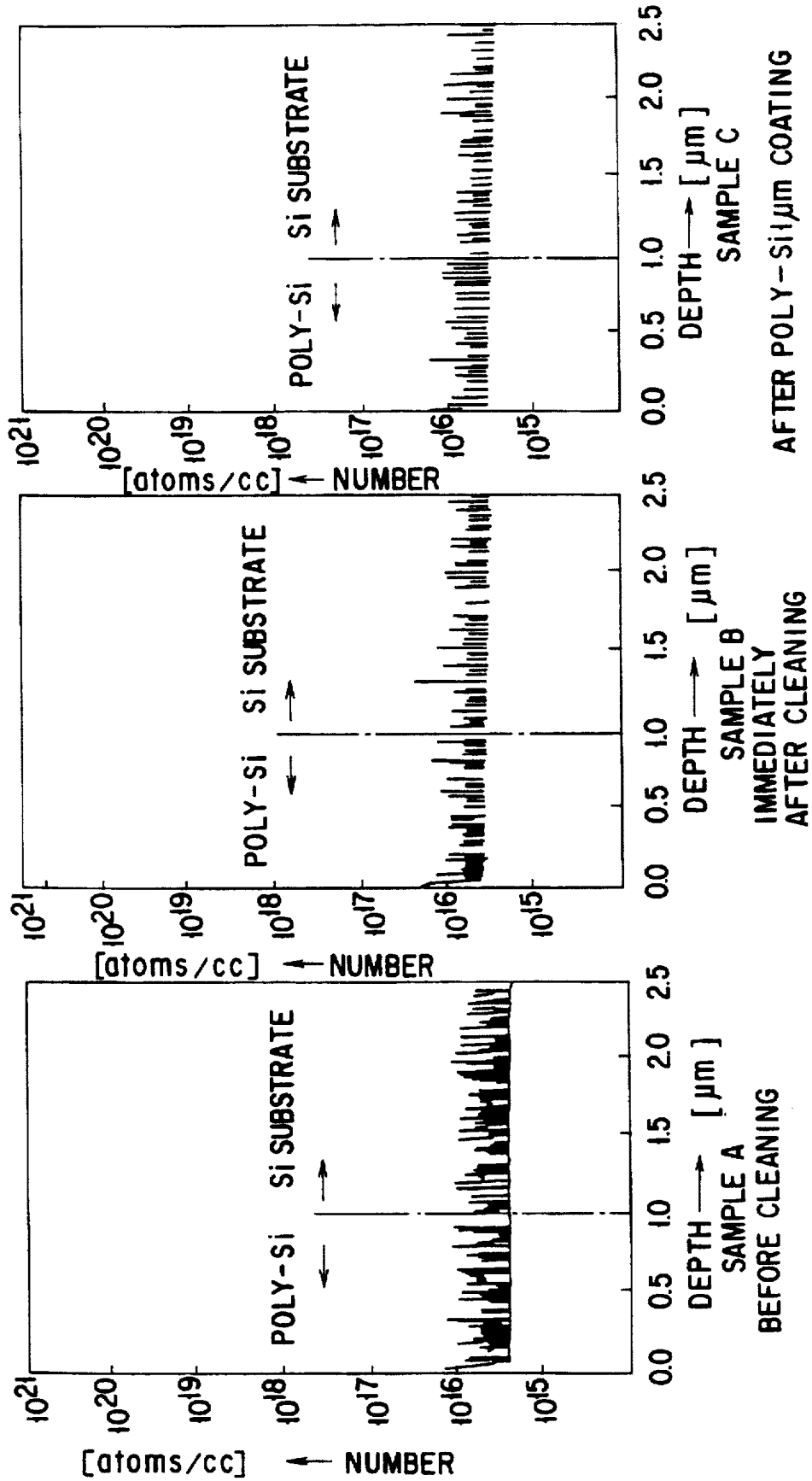
FIG. 22A  SAMPLE A BEFORE CLEANING
FIG. 22B  SAMPLE B IMMEDIATELY AFTER CLEANING
FIG. 22C  SAMPLE C AFTER POLY-Si 1μm COATING

VACUUM PROCESSING APPARATUS, VACUUM PROCESSING METHOD, AND METHOD FOR CLEANING THE VACUUM PROCESSING APPARATUS

This is a Continuation of application Ser. No. 08/255,950 filed on Jun. 7, 1994 now U.S. Pat No. 5,616,208.

BACKGROUND OF THE INVENTION

1. Field of the Invention

The present invention relates to a vacuum processing apparatus for processing a target object such as a semiconductor device, a vacuum processing method, and a method for cleaning the vacuum processing apparatus.

2. Description of the Related Art

In recent years, the integration density of a semiconductor integrated circuit element has increased, and the degree of integration has changed from the 64-M DRAM generation to the 256-M DRAM generation. For this reason, the number of layers of a wiring structure has more increased, and micropatterning thereof has become more conspicuous.

When the number of layers of the wiring structure increases as described above, the number of steps of a wiring process increases, and an increase in efficiency of the wiring process and dustproof measures therefor have posed problems more seriously than those of the conventional technique. In addition, with an increase in micropatterning level of the wiring structure, a migration disconnection becomes a problem in a conventional aluminum (Al) wiring structure. Therefore, as a wiring material replaceable with Al, a metal such as tungsten (W) having an excellent resistance to migration disconnection is variously examined.

In addition, with an increase in the number of layers of a wiring structure, burying of a contact hole, a via hole, and the like is variously examined with respect to a material. With an increase in diameter of a semiconductor wafer and an increase in the number of layers of the semiconductor wafer, the coverage of these layers becomes important.

For example, when a tungsten film is to be formed as a wiring film, blanket W wiring performed by a CVD method having excellent coverage is examined.

The wiring film formed by the blanket W is disadvantageously, easily peeled, and undesirably, easily generates particles. As a countermeasure against this, a method for forming a tightly adhering layer such as a titanium nitride film (TiN) as an underlying layer is employed. Although this TiN film is conventionally formed by a sputtering method or the like, since the sputtering method has limitations on coverage of the film at hole bottom portions each having a high aspect ratio, a method for forming a TiN using the CVD method having excellent coverage is examined.

In addition, as a method for burying a contact hole and a via hole, the blanket W or selection W in which tungsten is selectively buried into these holes using the chemical nature of a surface metal film or the like is examined.

The burying method performed by the blanket W requires a large number of processes such as a process of forming a tightly adhering layer formed of TiN, a blanket W process, an etch-back process, and its costs increase. For this reason, the burying method tends to be applied to the wiring structure of a specific semiconductor integrated circuit element having a high current density.

On the other hand, according to the burying method performed by the selection W, since hole portions can be selectively buried, no tightly adhering layer is required, and a multilayered wiring structure can be easily formed, thereby decreasing costs. For this reason, a method in which burying is performed by the selection W and a wiring layer is formed by sputtering Al is examined.

In addition, a horizontal gap between wiring layers decreases with an increase in micropatterning level of a wiring structure, the step of burying this gap is required for each wiring layer. For this reason, the number of steps required for the wiring process has increased with an increase in micropatterning level of the wiring structure.

With an increase in the number of layers of a semiconductor integrated circuit element and an increase in micropatterning level thereof, the wiring process has become complex, and has required a larger number of steps. These steps must be performed by properly combining metal film formation by a CVD method having an excellent coverage, burying, or metal film formation by a sputtering method as needed. A processing apparatus capable of performing these processes must be developed. In addition, in the wiring process, a plurality of steps of forming metal films and a plurality of steps of burying must be performed. For this reason, the throughput of the entire wiring process must be increased, and contamination caused by particles between these steps must be minimized. While the above problems are solved one by one, the quality of the wiring structure of a 256-M DRAM which will be popularly used must be assured to be equal to that of the wiring structure of a 64-M DRAM, and productivity of the 256-M DRAM must be improved.

As an effective processing apparatus which satisfies these requirements, a multi-chamber processing apparatus such as a cluster tool capable of continuously performing a plurality of processes with consistency has received considerable attention. This multi-chamber processing apparatus is an apparatus obtained by combining a plurality of film formation processing units and burying processing units in a module. This multi-chamber processing apparatus comprises a plurality of processing chambers for performing processes such as film formation in a predetermined vacuum state, a convey chamber having a convey mechanism for conveying target objects such as semiconductor wafers into these processing chambers, a cassette chamber for conveying the target objects into/from the convey chamber, and a preliminary vacuum chamber arranged between the convey chamber and the cassette chamber. The multi-chamber processing apparatus is a so-called one-by-one type processing apparatus constituted such that the wafers are continuously subjected to a film formation process, a burying process, and the like one by one in each processing chamber. In this multi-chamber processing apparatus, after a film formation process is performed by CVD or sputtering in each processing chamber, the processed wafer is continuously conveyed into a next process chamber by a convey unit in the convey chamber having a degree of vacuum equal to that of each of these processing chambers, the film formation process can be continuously performed, and a plurality of processes can be efficiently performed. For this reason, a throughput can be increased. In addition, since the convey chamber for connecting the processing chambers to each other is kept in a vacuum state, a target object can be conveyed in a clean atmosphere, the target object can be kept in a processing state obtained by each processing step, and reproducibility of each process can be improved. In addition, in the multi-chamber processing apparatus, processing chambers can be properly combined with each other in accordance with the process contents for a multilayered wiring structure, and a process design has a high degree of freedom.

However, when semiconductor integrated circuit elements ranging from a 64-M DRAM to a 256-M DRAM are to be manufactured, since a clean room is set in a super clean state, contamination caused by the clean room abruptly decreases. However, a degree of cleanness in the processing apparatus decreases, it is reported that 90% of particles are generated in the processing apparatus. More specifically, in each processing chamber, films are formed on not only a target object but also a susceptor for supporting the target object in the processing chamber, electrodes, and the like at once, and film formation is performed on the inner peripheral surface of the processing chamber. These films are peeled later and then float as particles or are deposited on the bottom surface of the processing chamber. In addition, in the convey chamber, particles are generated by the drive portion of the convey unit, and particles are generated by slip or the like of a target object during a convey operation. These particles float in the convey chamber and are deposited on the bottom portion of the convey chamber. When a process gas incompletely reacts during a film formation operation, intermediate products are deposited on the target object, and the products are conveyed into the convey chamber or other processing chambers during a convey operation, thereby causing cross-contamination. These products are gradually deposited on the bottom portion or the like, and particles float due to an air flow generated by supplying/exhausting gases during a process or an air flow generated when the convey system is driven. These particles contaminate the surface of the target object, thereby decreasing a yield.

Therefore, in order to prevent such contamination, in a conventional technique, a cleaning operation is performed each time a process such as a film formation process is performed a predetermined number of times to remove contaminants such as particles.

As a conventional method for cleaning a film formation apparatus, the following method is known. That is, a gas containing $NF_3$ is fed into a processing vessel as a cleaning gas, and films deposited on a mounting table or the inner surface of the processing vessel are removed by this cleaning gas. It is considered that this cleaning method is applied to a multi-chamber processing apparatus. According to this cleaning method, since the decomposition property of $NF_3$ itself used in this method is not very excellent, a plasma is utilized. More specifically, an electrode plate is arranged at a position opposing the mounting table in the processing vessel, and a high-frequency voltage is applied between the mounting table and the electrode to produce a plasma. This plasma excites NF3 to activate it, thereby enhancing a cleaning operation.

However, in the cleaning method using the above $NF_3$ plasma scheme, although a film on the surface of the mounting table on which a plasma is distributed and a film formed at the wafer peripheral portion on which the plasma is distributed can be effectively removed, films deposited on portions, on which the plasma is not distributed, e.g., the inner surface of the processing vessel, particularly, the inner surface of a supply head for a process gas, are peeled during a wafer convey operation. For this reason, film fractions deposited on the bottom portion of the vessel cannot be effectively removed. The above drawbacks of the cleaning method using the plasma scheme may become conspicuous when this method is applied to a multi-chamber processing apparatus. In addition, in the cleaning method using the plasma scheme, a plasma generating mechanism is required, thereby increasing the costs of the apparatus.

The method using the above plasma scheme is not applied for cleaning a multi-chamber processing apparatus, and the following method has been employed. That is, after the apparatus itself is disassembled, the component parts of the apparatus are immersed in a washing solution, and contaminants deposited on these parts are washed, or the contaminants deposited on the constituent parts are wiped up.

However, when such a method is employed, after the multi-chamber processing apparatus is disassembled, the component parts are dipped in a washing solution to wash contaminants deposited on these parts or to wipe up the contaminants. For this reason, a very long time is required for cleaning the multi-chamber processing apparatus, and the operating efficiency of the multi-chamber processing apparatus considerably decreases.

On the other hand, in order to more effectively clean the interior of a film forming apparatus, as disclosed in Jpn. Pat. Appln. KOKAI Publication Nos. 64-17857 and 2-77579, it is proposed that a ClF-based gas is used as a cleaning gas. According to a cleaning method using the ClF-based gas, undesired films formed in the apparatus can be effectively removed without using a plasma.

However, the ClF-based gas has high reactivity with respect to the parts in the apparatus, and these parts easily are worn or damaged by the ClF-based gas. In addition, the cleaning method using the ClF-based gas is applied to only an independent film forming apparatus. Therefore, a method for efficiently cleaning a multi-chamber processing apparatus without decreasing a throughput or the like has not yet been proposed.

SUMMARY OF THE INVENTION

It is an object of the present invention to provide a multi-chamber vacuum processing apparatus whose interior can be efficiently, almost completely cleaned.

It is another object of the present invention to provide a cleaning method capable of efficiently, almost completely cleaning the interior of a multi-chamber vacuum processing apparatus.

It is still another object of the present invention to a processing method capable of replacing a part, which is worn/damaged by cleaning, in a processing apparatus at a proper timing.

According to the first aspect of the present invention, there is provided a vacuum processing apparatus comprising:

a plurality of vacuum processing chambers for processing a target object using a process gas;

a vacuum convey chamber, connected to the plurality of vacuum processing chambers, for loading/unloading the target object into/from the processing chambers in a low-pressure atmosphere;

opening/closing means for opening/closing a path between the plurality of vacuum processing chambers and the vacuum convey chamber; and cleaning gas supply means for supplying a cleaning gas containing $ClF_3$ into at least one of the vacuum convey chamber and the vacuum processing chambers;

wherein the cleaning gas is supplied into the plurality of vacuum processing chambers and the vacuum convey chamber communicating with each other by opening the opening/closing means to clean the plurality of vacuum processing chambers and the vacuum convey chamber.

According to the second aspect of the present invention, second, there is provided a method for cleaning a vacuum processing apparatus comprising: a plurality of vacuum processing chambers for processing a target object using a process gas; a vacuum convey chamber, connected to the plurality of vacuum processing chambers, for loading/unloading the target object into/from the processing chambers in a low-pressure atmosphere; and opening/closing means for opening/closing a path between the plurality of vacuum processing chambers and the vacuum convey chamber, comprising the steps of:

opening the opening/closing means;

supplying a cleaning gas containing a ClF₃ gas into at least one of the convey chamber and the processing chambers;

diffusing the cleaning gas into the plurality of vacuum processing chambers and the vacuum convey chamber communicating with each other by the opening/closing means.

According to the third aspect of the present invention, there is provided a vacuum processing apparatus comprising:

a plurality of vacuum processing chambers for processing a target object using a process gas;

a vacuum convey chamber, connected to the plurality of vacuum processing chambers, for loading/unloading the target object into/from the vacuum processing chambers;

cleaning gas supply units arranged in the plurality of vacuum processing chambers and the vacuum convey chamber, respectively;

exhaust units arranged in the plurality of vacuum processing chambers and the vacuum convey chamber, respectively;

cleaning gas supply means for individually supplying a cleaning gas containing ClF₃ into the plurality of vacuum processing chambers and the vacuum convey chamber through the cleaning gas supply units; and exhaust means for individually exhausting the cleaning gas from the plurality of vacuum processing chambers and the vacuum convey chamber through the exhaust units.

According to the fourth aspect of the present invention, there is provided a method for cleaning a processing apparatus comprising a plurality of processing chambers for processing a target object using a process gas; a convey chamber, connected to the plurality of Processing chambers, for loading/unloading the target object into/from the processing chambers; and opening/closing means for opening/closing a path between the plurality of processing chambers and the convey chamber, comprising the steps of:

opening the opening/closing means; and individually supplying a cleaning gas containing ClF₃ into the plurality of processing chambers and the convey chamber, wherein the plurality of processing chambers and the convey chamber are individually cleaned with the cleaning gas.

According to the fifth aspect of the present invention, there is provided a method for cleaning a vacuum processing apparatus comprising: a plurality of vacuum processing chambers for processing a target object using a process gas; a vacuum convey chamber, connected to the plurality of vacuum processing chambers, for loading/unloading the target object into/from the processing chambers; and opening/closing means for opening/closing a path between the plurality of vacuum processing chambers and the vacuum convey chamber, comprising the steps of:

forming a plurality of spaces in the vacuum processing apparatus by selectively opening/closing the opening/closing means; and supplying a cleaning gas containing a ClF₃ having a concentration set in correspondence with each space into the spaces.

According to the sixth aspect of the present invention, there is provided a processing apparatus comprising:

a plurality of vacuum processing chambers for processing a target object using a process gas;

a vacuum convey chamber, connected to the plurality of vacuum processing chambers, for loading/unloading the target object into/from the vacuum processing chambers;

opening means for opening an interior of the apparatus to atmospheric air;

cleaning gas supply means for supplying a cleaning gas containing ClF₃ into the processing chambers and the convey chamber;

exhaust means for exhausting the cleaning gas;

concentration detection means for detecting Cl and F concentrations in the gas after cleaning using the cleaning gas is completed; and control means for outputting an opening command to the opening means when a detection value of the concentration detection means is smaller than a set value.

According to the seventh aspect of the present invention, there is provided a processing method in a vacuum processing apparatus comprising: a plurality of vacuum processing chambers for processing a target object using a process gas; a vacuum convey chamber, connected to the plurality of vacuum processing chambers, for loading/unloading the target object into/from the processing chambers; and opening/closing means for opening/closing a path between the plurality of vacuum processing chambers and the vacuum convey chamber, comprising the steps of:

selectively closing the opening/closing means between the vacuum convey chamber and at least one of the vacuum processing chambers;

performing a process using the process gas to the target object in at least one of the vacuum processing chambers; and supplying a cleaning gas containing ClF₃ into remaining chambers to clean the remaining chambers simultaneously with the step of performing the process.

According to the eighth aspect of the present invention, there is provided a method for cleaning a vacuum processing apparatus comprising: a plurality of vacuum processing chambers for processing a target object using a process gas; and a vacuum convey chamber, connected to the plurality of vacuum processing chambers, for loading/unloading the target object into/from the processing chambers, comprising the steps of:

recognizing the number of target objects processed until cleaning must be performed in each of the vacuum processing chambers; and supplying a cleaning gas containing ClF₃ into the plurality of vacuum processing chambers and the vacuum convey chamber to clean the plurality of vacuum processing chambers and the vacuum convey chamber when the number of processed objects reaches the number of target objects.

According to the ninth aspect of the present invention, there is provided a method for cleaning a vacuum processing apparatus comprising: a plurality of vacuum processing chambers for processing a target object using a process gas; and a vacuum convey chamber, connected to the plurality of vacuum processing chambers, for loading/unloading the target object into/from the processing chambers, comprising the steps of:

supplying a cleaning gas containing ClF into the plurality of vacuum processing chambers and the vacuum convey chamber to clean the plurality of vacuum processing chambers and the vacuum convey chamber;

evacuating the vacuum processing chambers and the vacuum convey chamber upon completion of cleaning; and intermittently supplying an inert gas into the plurality of vacuum processing chambers and the vacuum convey chamber and stop of the supply while the evacuation is performed.

According to the tenth aspect of the present invention, there is provided a method for cleaning a vacuum processing apparatus comprising: a plurality of vacuum processing chambers for processing a target object using a process gas; and a vacuum convey chamber, connected to the plurality of vacuum processing chambers, for loading/unloading the target object into/from the processing chambers; and a vacuum exhaust system for evacuating the vacuum processing chambers and the vacuum convey chamber, comprising the steps of:

supplying a cleaning gas containing $ClF_3$ into some or all of the plurality of vacuum processing chambers and the vacuum convey chamber to perform cleaning of the corresponding chambers; and exhausting the cleaning gas by the vacuum exhaust system during the cleaning.

According to the eleventh aspect of the present invention, there is provided a vacuum processing apparatus comprising:

a vacuum processing chamber for processing a target object using a process gas;

cleaning gas supply means for supplying a cleaning gas into the vacuum processing chamber;

replacement command means, prestoring an amount of wear/damage of a component part of the chamber caused by the cleaning gas, for commanding replacement of the component part on the basis of a value of the amount of wear and the number of cleaning cycles.

According to the twelfth aspect of the present invention, there is provided a vacuum processing apparatus comprising:

a plurality of vacuum processing chambers for processing a target object using a process gas;

a vacuum convey chamber, connected to the plurality of vacuum processing chambers, for loading/unloading the target object into/from the vacuum processing chambers;

cleaning gas supply means for supplying a cleaning gas into the plurality of vacuum processing chambers and the vacuum convey chamber;

replacement command means, prestoring an amount of wear/damage of a component part of the chamber caused by the cleaning gas, for commanding replacement of the component part on the basis of a value of the amount of wear and the number of cleaning cycles.

According to the thirteenth aspect of the present invention, there is provided a vacuum processing method using a vacuum processing apparatus for processing a target object using a process gas, comprising the steps of:

processing the target object using the vacuum processing apparatus;

cleaning the vacuum processing apparatus with a cleaning gas;

recognizing the number of cleaning cycles for replacement of a component part on the basis of the amount of wear of the component part of the processing apparatus caused by the cleaning gas.

Note that it is intended that the vacuum processes in the present invention include all processes performed at a pressure lower than the atmospheric pressure.

BRIEF DESCRIPTION OF THE DRAWINGS

FIG. 3 is a view showing the processing chamber and cleaning gas supply system in the multi-chamber vacuum processing apparatus in FIG. 1;

FIG. 11 is a view showing another multi-joint arm portion used in the convey chamber;

FIG. 12 is a view showing an atmospheric air opening mechanism in a cassette chamber;

FIG. 13 is a view for explaining another embodiment of a method for cleaning a multi-chamber vacuum processing apparatus;

FIG. 20 is a flow chart showing the procedure of particle evaluation;

FIGS. 21A and 21B are graphs showing results obtained by particle evaluation;

FIGS. 22A to 22C are graphs showing results obtained by contamination evaluation of Fe.

DETAILED DESCRIPTION OF THE PREFERRED EMBODIMENTS

Preferable embodiments of the present invention will be described below with reference to the accompanying drawings.

Figure 1:
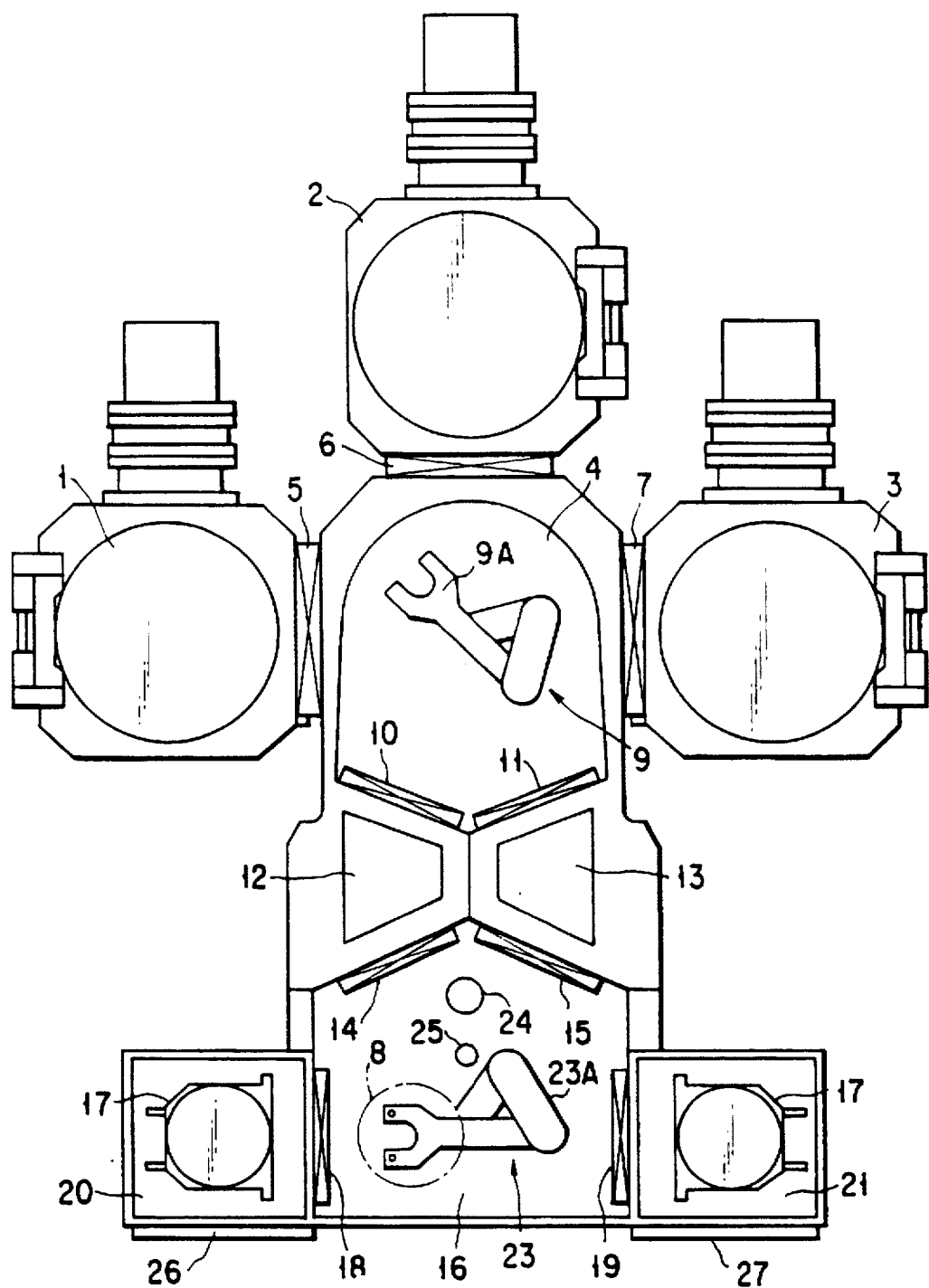
FIG. 1 is a view showing a multi-chamber vacuum processing apparatus according to an embodiment of the present invention.

FIG. 1 shows a multi-chamber vacuum processing apparatus according to an embodiment of the present invention. This multi-chamber vacuum processing apparatus constitutes a so-called cluster tool type vacuum processing apparatus.

The multi-chamber vacuum processing apparatus shown in FIG. 1 has a plurality (in this case, three) of processing chambers 1, 2, and 3 for performing a film formation process, e.g., a film formation process of a metal such as tungsten, for a semiconductor wafer serving as a target object in a predetermined vacuum state. These processing chambers 1, 2, and 3, as shown in FIG. 1, are connected to three side surfaces of a first convey chamber 4 having an almost rectangular shape and kept in a vacuum state, through gate valves 5, 6, and 7, respectively. The processing chambers 1, 2, and 3 communicate with the first convey chamber 4 by opening these gate valves 5, 6, and 7, respectively, and are disconnected from the first convey chamber 4 by closing these gate valves 5, 6, and 7, respectively. A cleaning gas supply source (to be described later) is connected to at least one of the Processing chambers 1, 2, and 3.

The first convey chamber 4 has a convey unit 9 and, the convey unit 9 conveys a target object, e.g., a semiconductor wafer 8, between the first convey chamber 4 and the processing chambers 1, 2, and 3. The first convey chamber 4 is designed to have the degree of vacuum almost equal to that of each of the processing chambers 1, 2, and 3. This convey unit 9 is arranged at an almost central position in the first convey chamber 4, and has a multi-joint arm portion 9A. The multi-joint arm portion 9A places the semiconductor wafer 8 on the hand of the multi-joint arm portion 9A to convey the semiconductor wafer B.

Two preliminary vacuum chambers 12 and 13 are arranged to be able 0 communicate with the remaining side surface of the -first convey chamber 4 through gate valves 10 and 71, respectively. The preliminary vacuum chambers 12 and 13 communicate with the first convey chamber 4 by opening the gate valves 10 and 11, respectively, and disconnected from the first convey chamber 4 by closing the gate valves 10 and 11, respectively.

Therefore, when the semiconductor wafer 8 is transferred by the convey unit 9 from, e.g., the preliminary vacuum chamber 12 to a predetermined processing chamber in a predetermined vacuum atmosphere, a predetermined film formation process is performed to the semiconductor wafer 8 in this processing chamber, and the processed semiconductor wafer 8 is sequentially transferred by the convey unit 9 to other processing chambers. After predetermined processes in these processing chambers are completed, the semiconductor wafer 8 can be transferred into the other preliminary vacuum chamber 13 again.

Gate valves 14 and 15 are arranged at portions opposing the gate valves 10 and 11 of the preliminary vacuum chambers 12 and 13, respectively. The preliminary vacuum chambers 12 and 13 are connected to a second convey chamber 16 through the gate valves 14 and 15, and the preliminary vacuum chambers 12 and 13 communicate with the second convey chamber 16 by opening the gate valves 14 and 15, and are disconnected from the second convey chamber 16 by closing the gate valves 14 and 15.

Cassette chambers 20 and 21 for storing cassettes 17 for semiconductor wafers are connected to both the left and right side surfaces of the second convey chamber 16 through gate valves 18 and 19. The cassette chambers 20 and 21 communicate with the second convey chamber 16 by opening the gate valves 14 and 15, respectively, and are disconnected from the second convey chamber 16 by closing the gate valves 14 and 15, respectively.

In the second convey chamber 16, a second convey unit 23 is arranged at the central position between the left and right cassette chambers 20 and 21. The semiconductor wafer 8 is conveyed by a multi-joint arm portion 23A of the second convey unit 23 between the preliminary vacuum chambers 12 and 13 and the cassette chambers 20 and 21. Note that the detailed structure of the second convey unit 23 will be described later.

A positioning mechanism 24 for optically positioning the semiconductor wafer 8 with reference to the orientation flat of the semiconductor wafer 8 is arranged between the second convey unit 23 and the preliminary vacuum chambers 12 and 13. After the semiconductor wafer 8 is temporarily positioned by the positioning mechanism 24, the semiconductor wafer 8 is conveyed by the second convey unit 23 into the preliminary vacuum chamber 12.

The second convey chamber 16 has a pressure adjustment unit (not shown) for supplying an inert gas such as a nitrogen gas into the second convey chamber 16 and adjusting and holding the pressure of the inert gas at the atmospheric pressure. The second convey chamber 16 is set, by this pressure adjustment unit, in an nitrogen gas atmosphere having the atmospheric pressure. In this state, the semiconductor wafer 8 is conveyed between the cassettes 17 in the cassette chambers 20 and 21 and the preliminary vacuum chambers 12 and 13. The second convey chamber 16 is kept at a predetermined degree of vacuum during cleaning.

An exhaust port 25 for exhausting a cleaning gas is formed in the bottom surface of the second convey chamber 16, a cleaning gas supplied from at least one of the processing chambers 1, 2, and 3 and spread in the first convey chamber 4, the preliminary vacuum chambers 12 and 13, and the cassette chambers 20 and 21 as needed is exhausted from the exhaust port 25. This exhaust port 25 is connected to the exhaust systems of the preliminary vacuum chambers 12 and 13 through valves (not shown), and the second convey chamber 10 is evacuated through the exhaust port 25 using the exhaust systems during cleaning. While cleaning is not performed, these valves are kept closed, and only the preliminary vacuum chambers 12 and 13 are evacuated.

Exhaust systems are arranged to She chambers such as processing chambers 1, 2, and 3, the first convey chamber 4, and the preliminary vacuum chambers 12 and 13, respectively. While a process is performed, these chambers can be individually evacuated.

Reference numerals 26 and 27 denote gates arranged on the front surfaces of the cassette chambers 20 and 21, respectively.

Figure 2:
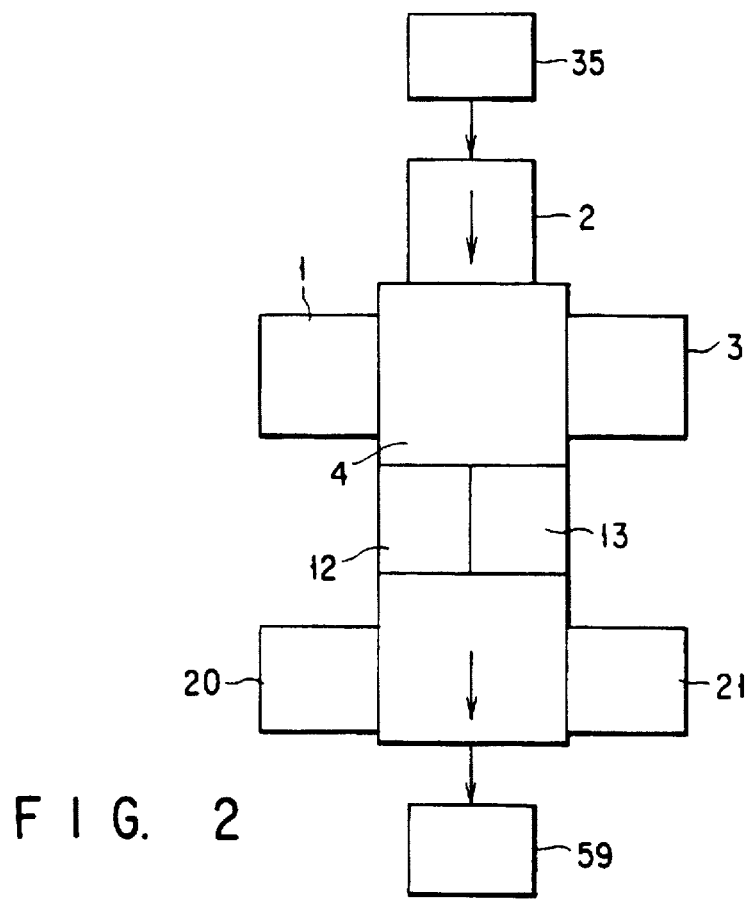
FIG. 2 is a view for explaining a gas flow in an embodiment of a cleaning method according to the present invention.

The cleaning gas supply mechanism of this apparatus will be described below. In the multi-chamber processing apparatus of this embodiment, a cleaning gas supply system is connected to at least one of the processing chambers 1, 2, and 3, as described above. A cleaning gas is supplied into the processing chamber to which the cleaning supply system is connected, and this cleaning gas is exhausted from the exhaust port 25 of the second convey chamber 16 through other processing chambers, the first convey chamber 4, the preliminary vacuum chambers 12 and 13, and, if necessary, the cassette chambers 20 and 21. FIG. 2 conceptually shows the flow of the cleaning gas at this time. As shown in FIG. 2, when the cleaning gas Us supplied from the cleaning gas supply system 35 into the processing chamber 2, the cleaning gas is sequentially spread in all the chambers, and the cleaning gas is exhausted from the exhaust port 25 of the second convey chamber 16 by an exhaust system 59 of the preliminary vacuum chambers 12 and 13.

When the cleaning gas is distributed in each chamber at a predetermined concentration, exhaustion of the cleaning gas may be stopped for a predetermined period of time, or supply of the cleaning gas may be stopped a predetermined period of time after exhaustion is stopped. Alternatively, exhaustion and supply of the cleaning gas may be repeated in a pulsed form.

As the cleaning gas, a gas containing Cl and F, typically, a $ClF_3$ gas is used. This gas may be singly used, or the gas may be diluted with a nitrogen gas or the like. This $ClF_3$ is chemically active, and a satisfactory cleaning effect can be obtained without generating a plasma from the $ClF_3$ gas. In particular, this gas effectively reacts with a tungsten-based film, and the $ClF_3$ gas can effectively remove tungsten-based deposits. However, the $ClF_3$ effectively reacts with not only tungsten but also other metals such as titanium- and molybdenum-based compounds, and the $ClF_3$ can effectively remove these metal compounds. In this cleaning, a cleaning atmosphere may be heated.

When only a $ClF_3$ gas is used as a cleaning gas, cleaning is preferably performed under the following conditions: the flow rate of the $ClF_3$ gas is set to be 5 l/min. or less; the temperature of the $ClF_3$ gas is set to be the boiling point of $ClF_3$ to 700° C.; the internal pressure is set to be 0.1 to 100 Torr. When the flow rate of the $ClF_3$ gas exceeds 5 l/min., the materials constituting the chambers may be damaged. When the temperature of the $ClF_3$ gas is lower than the boiling point, condensation of $ClF_3$ occurring on the constituent members may damage the materials of the constituent members. When the temperature exceeds 700° C., the $ClF_3$ gas is activated, and the materials may be damaged. When the pressure of the $ClF_3$ gas is less than 0.1 Torr, a cleaning effect may not be expected; when the pressure exceeds 100 Torr, the constituent materials may be damaged. In addition, when the $ClF_3$ gas is diluted with an inert gas, e.g., a nitrogen gas to suppress the reactivity of the $ClF_3$ gas, an object to be cleaned is moderately cleaned, damage to the object can be relieved.

A gas supply system for supplying a cleaning gas and a processing chamber will be described below with reference to FIG. 3. Various processing units are selectively applied to the processing chambers 1, 2, and 3 depending on processes to be performed. For example, a spattering processing unit, a thermal CVD processing unit, and an etching processing unit are applied to the processing chambers 1, 2, and 3, respectively. As an example, the thermal CVD unit applied to the processing chamber 2 will be described below.

The processing chamber 2, as shown in FIG. 3, has an almost cylindrical shape and is formed of, e.g., aluminum, and the processing chamber 2 can be kept at a predetermined degree of vacuum. A susceptor 28 for placing the semiconductor wafer 8 thereon is arranged at the almost central position of a bottom surface 2A in the processing chamber 2, and a gas dispersion/supply unit 29 for supplying a process gas or a cleaning gas is arranged above the susceptor 28 and opposes the susceptor 28. In addition, on the outside of the bottom wall of the processing chamber 2, a window 30 consisting of quartz is arranged at a position opposing the susceptor 28. A heating halogen lamp 31 is arranged under the window 30 with a small interval. Optical energy is supplied from the halogen lamp 31 onto the semiconductor wafer 8 on the susceptor 28 through the quartz window 30, thereby heating the semiconductor wafer 8.

As shown in FIG. 3, a process gas supply system 32 for supplying a process gas is connected to the gas dispersion/supply unit 29 through a pipe 33, and the predetermined process gas is supplied into the processing chamber 2 through the gas dispersion/supply unit 29 by opening a valve 34 connected to the pipe 33. For example, when a blanket W process is to be performed in the processing chamber 2, tungsten hexafluoride ($WF_6$) and hydrogen are supplied as a process gas from the process gas supply system 32 to the gas dispersion/supply unit 29, and the process gas is uniformly supplied into the entire space of the processing chamber 2 through a plurality of dispersion holes 29A formed in the lower surface of the gas dispersion/supply unit 29. Note that a halide, a carbonyl compound, or an organic metal compound is used as a process gas for metal wiring, and such a material is supplied together with a reducing agent. As a compound for obtaining a wiring material, a compound having a relatively low vapor pressure is preferably used.

As shown in FIG. 3, a cleaning gas supply system 35 for supplying a cleaning gas is connected to the pipe 33 through a pipe 36, and the cleaning gas is supplied from the cleaning gas supply system 35 into the processing chamber 2 through the pipe 30, the pipe 33, and the gas dispersion/supply unit 29 during cleaning. The cleaning gas supply system 35 comprises a $ClF_3$ gas bomb 37 for storing a $ClF_3$ gas serving as a cleaning gas and a nitrogen gas bomb 38 for storing a nitrogen gas for diluting the $ClF_3$ gas. These gas bombs 37 and 38 are connected to the end portions of pipes 36A and 36B branched from the pipe 36, respectively. A valve 39, a mass-flow controller 40, and a valve 41 are sequentially connected to the pipe 36A, to which the $ClF_3$ gas bomb 37 is connected, from the upstream side to the downstream side. A valve 42, a mass-flow controller 43, and a valve 44 are sequentially connected to the pipe 36B, to which the $ClF_3$ gas bomb 37 is connected, from the upstream side to the downstream side. The gases from the gas bombs 37 and 38 are mixed with each other in the pipe 36, and the cleaning gas is supplied into the processing chamber 2 through the pipe 33 and gas the dispersion/supply unit 29 by opening a valve 45.

Exhaust ports 46 are formed in the bottom surface 2A of the processing chamber 2 near the susceptor 28. Exhaust pipes 48 are connected to the exhaust ports 46, the processing chamber 2 is evacuated by the vacuum exhaust pump 49, and the processing chamber 2 is set at a predetermined degree of vacuum.

The vacuum exhaust pump 49 can also be used as an exhaust means for exhausting the cleaning gas when cleaning using the $ClF_3$ gas is performed. As the vacuum exhaust pump 49, an oil-free dry pump is preferably used not to be affected by the exhausted gas.

A toxicity-removing unit 50 for catching toxic gases such as the process gas and cleaning gas exhausted from the vacuum exhaust pump 49 to remove these toxic gases from the exhausted gas is arranged on the downstream side of the vacuum exhaust pump 49. As the toxicity-removing unit 50, a unit filled with a solvent, e.g., an alkaline solution for easily dissolving $ClF_3$, is used.

Figure 4:
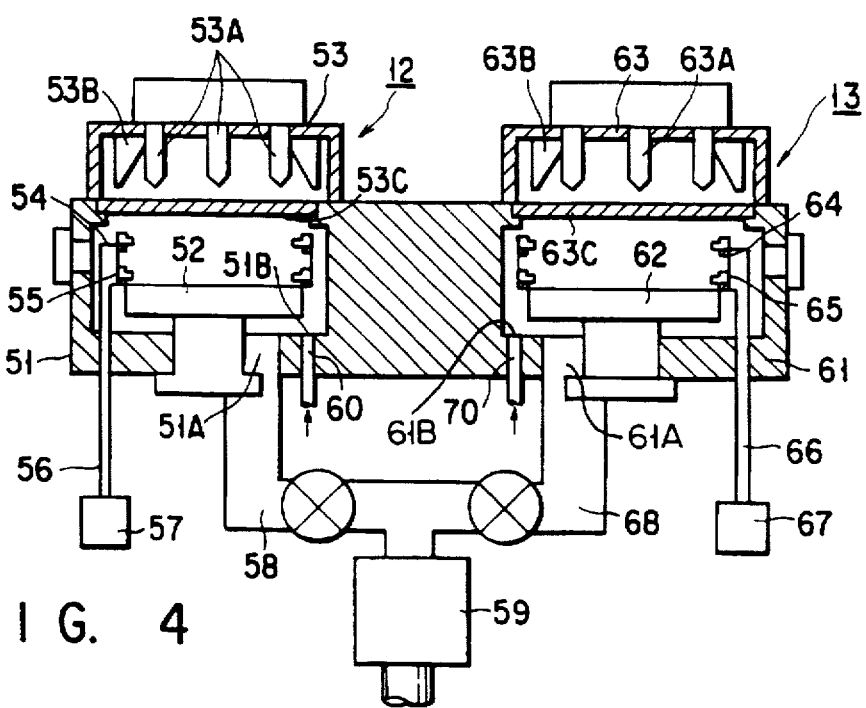
FIG. 4 is a view showing the preliminary vacuum chamber in the multi-chamber vacuum processing apparatus in FIG. 1.

The preliminary vacuum chambers 12 and 13 will be described below with reference to FIG. 4. The preliminary vacuum chamber 12 comprises a preliminary chamber body 51 consisting of the same material as that of the processing chamber, a cooling stage 52 which is arranged in the preliminary chamber main body 51 and cools a semiconductor wafer, a heating unit 53 which is arranged above the upper surface of the preliminary chamber body 51 to oppose the cooling stage 52 and preliminarily heats the semiconductor wafer, two, i.e., upper and lower support members 54 and 55 For supporting the semiconductor wafer between the heating unit 53 and the cooling stage 52, a connection shaft 56 which is integrally connected to the support members 54 and 55 and extends through the bottom surface of the preliminary chamber main body 51, and a lifting mechanism 57 which is connected to the lower end of the connection shaft 56 and vertically moves the support members 54 and 55.

An exhaust port 51A is formed in the bottom surface of the preliminary chamber body 51, an exhaust pump 59 is connected to the exhaust port 51A through an exhaust pipe 58, and the preliminary chamber body 51 is evacuated by the exhaust pump 59. A gas supply port 51B is formed near the exhaust port 51A, and a gas supply source (not shown) is connected to the gas supply port 51B through a supply pipe 60. When an inert gas or the like is supplied from the gas supply source into the preliminary chamber body 51, the pressure in this preliminary chamber body 51 is returned to the atmospheric pressure. This exhaust pump 59 can also be used to exhaust the cleaning gas supplied during cleaning.

The heating unit 53 has a heating lamp 53A constituted by a halogen lamp or the like and a reflecting plate 53B for reflecting light from the heating lamp 53A onto the preliminary chamber main body 51. Optical energy emitted from the heating lamp 53A and reflected by the reflecting plate 53B is radiated onto the semiconductor wafer in the preliminary chamber body 51 through a quartz window 53C arranged on the upper surface of the preliminary chamber main body 51, thereby heating the semiconductor wafer. That is, the semiconductor wafer is preliminarily heated before it is conveyed into a processing chamber. In this case, the semiconductor wafer which is not processed is preliminarily heated such that the support member 54 is moved upward by the lifting mechanism 57 to bring the semiconductor wafer near the heating unit 53.

Figures 5, 6A, 6B:
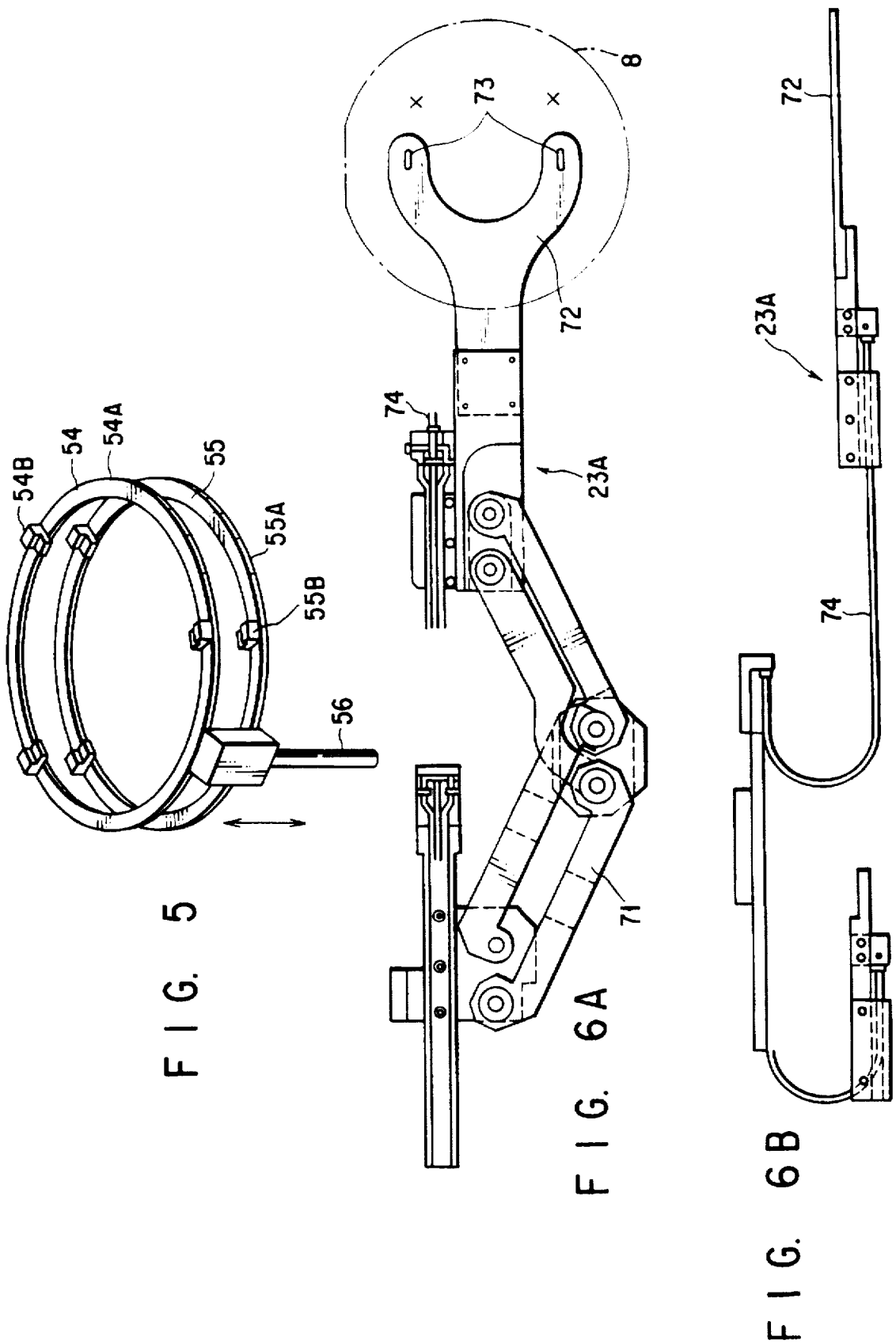
FIG. 5 is a perspective view showing a support member of a semiconductor wafer used in the preliminary vacuum chamber in FIG. 4.
FIGS. 6A and 6B are plan and side views, respectively, showing a convey unit used in a second convey chamber.

When the processed semiconductor wafer is to be unloaded from the preliminary vacuum chamber 12, the semiconductor wafer is cooled in accordance with the external temperature. In this case, the processed semiconductor wafer is cooled such that the support member 55 is moved downward by the lifting mechanism 57 to bring the semiconductor wafer into contact with the cooling stage 52. The support members 54 and 55, as shown in FIG. 5, have rings 54A and 55A formed to have diameters larger than the outer diameter of the cooling stage 52, and three holding pawls 54B and three holding pawls 55B are arranged on the rings 54A and 55A along the circumference directions thereof at equal intervals, respectively. The semiconductor wafer is held by these pawls 54B and 55B.

The other preliminary vacuum chamber 13, similar to the preliminary vacuum chamber 12, comprises a preliminary chamber main body 61, a cooling stage 62, a heating unit 63, support members 64 and 65, a connection shaft 66, a lifting mechanism 67, an exhaust pipe 68, and a gas supply pipe 70.

The second convey unit 23 arranged in the second convey chamber 16 connected to the preliminary vacuum chambers 12 and 13 will be described below with reference to FIGS. 6A and 6B. The second convey unit 23 has the arm portion 23A and a vacuum pump (not shown) for chucking the semiconductor wafer on the arm portion 23A. The arm portion 23A has an arm 71 arranged by a linking mechanism and a hand 72 connected to the distal end of the arm 71. Holes 73 for vacuum-chucking the semiconductor wafer are formed in the upper surface of the hand 72. While the semiconductor wafer 8 is placed on the hand 72, exhaustion is performed by the vacuum pump through a vacuum exhaust pipe 74, thereby vacuum-sucking the semiconductor wafer 8 on the hand 72.

While the second convey chamber 16 is held at the atmospheric pressure or more, when the semiconductor wafer 8 is to be transferred by the second convey unit 23 from the cassette 17 into the preliminary vacuum chamber 12, the arm 71 is extended to be inserted between the semiconductor wafers 8 in the cassette 17, and one of the semiconductor wafers 8 is placed on the hand 72. At the same time, exhaustion is performed by the vacuum pump through the vacuum exhaust pipe 74 to accurately chuck and fix the semiconductor wafer 8, and the semiconductor wafer 8 is conveyed into the preliminary vacuum chamber 12 without dropping out of the hand 72. After the semiconductor wafer 8 is conveyed, the vacuum suction is released to accurately place the semiconductor wafer 8 at a predetermined position.

A wiring film formation process using the multi-chamber processing apparatus will be described below.

For example, in the processing chamber 1, TiN is spattered to form an adhering layer on the surface of each contact hole of the semiconductor wafer. In the processing chamber 2, tungsten is buried, by a blanket W process, into each contact hole of the semiconductor wafer processed in the processing chamber 1. In the processing chamber 3, a process is performed such that the tungsten is etched back from the surface of the semiconductor wafer buried with the tungsten in the processing chamber 2 to leave the tungsten in only each contact hole. In these processing chambers, these wiring processes are simultaneously performed to different semiconductor wafers, respectively. Each semiconductor wafer processed in a corresponding one of the processing chambers is conveyed into a chamber for a process next to the previous process, and the next process is performed continuously with the previous process. Naturally, each processing chamber is kept at a degree of vacuum required for a corresponding one of the processes.

For example, the blanket W process in the processing chamber 2 will be described below. When tungsten hexafluoride ($WF_6$) and hydrogen serving as a process gas are supplied from the process gas supply system 32 into the gas dispersion/supply unit 29, the process gas is uniformly supplied from the dispersion holes 29A of the lower surface of the gas dispersion/supply unit 29 into the entire space of the processing chamber 2. At this time, optical energy from the halogen lamp 31 is radiated on the susceptor 28 through the window 30, and the semiconductor wafer 8 supported by the susceptor 28 is heated to a predetermined temperature. When the process gas is brought into contact with the semiconductor wafer 8 heated as described above, the $WF_6$ is reduced by hydrogen with the thermal energy, and a tungsten film is formed on the entire surface of the semiconductor wafer 8. In this process, a tungsten film is formed on not only the surface of the semiconductor wafer B but also on other portions such as the susceptor 28.

Upon completion of the film formation process using blanket W in the processing chamber 2, the semiconductor wafer is removed from the processing chamber 2 by the first convey unit 9 in the first convey chamber 4 and then conveyed into a processing chamber for performing the next process. As in each of the processing chambers 1 and 3, upon completion of the process in a corresponding one of the processing chambers 1 and 3, a semiconductor wafer is conveyed by the first convey unit 9 in the first convey chamber 4 into a predetermined processing chamber or a preliminary vacuum chamber.

More specifically, while the semiconductor wafers 8 are conveyed, the gate valves 5, 6, and 7 of the processing chambers are opened, and the gate valves 10 and 11 of the preliminary vacuum chambers 12 and 13 are sequentially opened, thereby causing the chambers to communicate with each other. In this state, the semiconductor wafer 8 in the processing chamber 3 is transferred by the first convey unit 9 onto the support members 54 and 55 in the preliminary vacuum chamber 13. The arm 9A of the first convey unit 9 is moved backward from the preliminary vacuum chambers 12 and 13 and then extended into the processing chamber 2. In this manner, the semiconductor wafer 8, to which a blanket W process is performed, on the susceptor 28 is unloaded and then conveyed into the processing chamber 3. Thereafter, the arm 9A is extended into the preliminary vacuum chamber 12 to unload, from the support member 54, the semiconductor wafer 8 preliminarily heated by the heating unit 53, and the semiconductor wafer 8 is conveyed into the processing chamber 1. Upon completion of the series of operations, the gate valves are sequentially closed. In this state, the apparatus is ready for the next operation.

In the preliminary vacuum chamber 12, when the gate valve 10 is closed, the gate valve 14 is opened. After the next semiconductor wafer 8 is positioned by the positioning mechanism 24, the semiconductor wafer 8 is conveyed onto the support member 55 of the preliminary vacuum chamber 12 by the second convey unit 23. The support member 55 is moved upward by the lifting mechanism 57 to a position near the upper surface of the preliminary chamber main body 51. At this time, in the preliminary chamber main body 51, the exhaust pump 59 is driven to evacuate this chamber such that the pressure in the chamber has a degree of pressure equal to that of the first convey chamber 4. At the same time, the semiconductor wafer 8 is preliminarily heated by the heating unit 53, and the apparatus is ready for the next process.

On the other hand, in the preliminary vacuum chamber 13 having the closed gate valve 11, a nitrogen gas is supplied from the gas supply pipe 70 into the preliminary chamber main body 61 to set the pressure in this chamber to the atmospheric pressure level. At the same time, the support member 64 is moved downward by the lifting mechanism 67 to bring the semiconductor wafer 8 into contact with the cooling stage 62, thereby cooling the semiconductor wafer 8 to room temperature. Upon completion of cooling, the gate valve 15 is opened to cause the preliminary vacuum chamber 13 to communicate with the second convey chamber 16, and the semiconductor wafer 8 on the support member 65 is conveyed by the second convey unit 23 into the cassette 17 in the cassette chamber 21. In this case, since the second convey unit 23 vacuum-sucks the semiconductor wafer 8 through the holes 73 of the hand 72, the semiconductor wafer 8 can be reliably transferred.

The series of processes in the multi-chamber processing apparatus are completed as described above.

After the series of processes are performed to all the semiconductor wafers 8 stored in the cassette 17, the cassette 17 is replaced with a cassette in which semiconductor wafers 8 to be processed are stored.

With the above film formation process, films are slightly formed on the wall surfaces in the processing chambers 1, 2, and 3, the susceptor 28, or other portions. When the film formation process is repeated, these films are stacked on each other, and these films are eventually peeled to form particles. These particles float in these chambers to contaminate the cleaned semiconductor wafer 8 as described above. In addition, in each of the processing chambers 1, 2, and 3, incompletely reacted reaction products or decomposed products are deposited on the semiconductor wafer 8. For this reason, during the convey process of the semiconductor wafer 8, these reaction products or decomposed products are scattered from the semiconductor wafer 8 into the processing chambers 1, 2, and 3 and other chambers such as the first convey chamber 4, the preliminary vacuum chambers 12 and 13, and the second convey chamber 16 to be gradually accumulated on the bottom portions of these chambers. These products may form particles to contaminate the semiconductor wafer 8. Moreover, in the first and second convey chambers 4 and 16, particles are formed by the drive portions of the convey units 9 and 23, respectively, and these particles are gradually accumulated on the bottom surfaces of the chambers 4 and 16, respectively. During the convey process of the semiconductor wafer 8, these particles may float and contaminate the semiconductor wafer 8.

After the film formation process is performed several times, the film formation process is temporarily interrupted, and the multi-chamber processing apparatus is cleaned by supplying a cleaning gas thereinto, thereby removing films, dust, or the like.

In this embodiment, as described above, plasmaless ClF-based cleaning gas is supplied into at least one of the processing chambers to clean the interior of the apparatus. For example, a case wherein the cleaning gas is supplied into the processing chamber 2, to clean the entire interior of the multi-chamber processing apparatus will be described below. In this case, all the gate valves for disconnecting the chambers from each other are opened in the multi-chamber processing apparatus to cause all the chambers to communicate with each other. Thereafter, the power supply for the halogen lamp 31 in the processing chamber 2 is turned off, and a state wherein no semiconductor wafer 8 is present in the processing chambers 1, 2, and 3 is kept. A cleaning gas from the cleaning gas supply system 35 connected to the processing chamber 2 is supplied into the processing chamber 2, thereby starting cleaning. Note that, when this cleaning is to be performed, a process gas in each of the processing chambers 1, 2, and 3 is preferably reduced with a nitrogen gas or the like in advance.

In the cleaning, the vacuum pump 49 of each of the processing chambers 1, 2, and 3 and the vacuum pump 59 of each of the preliminary vacuum chambers 12 and 13 are driven at room temperature higher than the boiling point of $ClF_3$, and a nitrogen gas is exhausted from the processing chambers 1, 2, and 3, the preliminary vacuum chambers 12 and 13, and the second convey chamber 16 to keep each of the chambers of the multi-chamber processing apparatus at a predetermined degree of vacuum. While this evacuation state is kept, the valves 39, 41, and 45 of the cleaning gas supply system 35 at a predetermined degree of opening, the $ClF_3$ gas is fed into the processing chamber 2 through the pipe 33 and the gas dispersion/supply unit 29 such that the flow rate of the $ClF_3$ gas is controlled by the mass-flow controller 40 to a predetermined flow rate, e.g., 5 l/min. or less. The $ClF_3$ gas is spread in all the chambers to keep the pressure of each of the chambers at a degree of vacuum of 0.1 to 100 Torr. At this time, the cleaning gas flows from the processing chamber 2 into the first convey chamber 4, and is spread in the other processing chambers 1 and 3. In addition, since the preliminary vacuum chambers 12 and 13 and the second convey chamber 16 are evacuated from the exhaust ports 51A, 61A, and 25 by the exhaust pump 59, respectively, the cleaning gas is spread in all the chambers after all. More specifically, as shown in FIG. 2, when the cleaning gas is fed from one processing chamber, the cleaning gas is spread in all the chambers, and the pressure of the cleaning gas is kept at a predetermined value of, e.g., 0.1 to 100 Torr.

Since the $ClF_3$ gas spread in all the chambers is a chemically active gas, this gas reacts with the tungsten-based films formed in the processing chambers 1, 2, and 3 or deposits deposited on the bottom surfaces of the processing chambers 1, 2, and 3 and the other chambers during the processes, thereby removing these films and deposits. Therefore, the interiors of these chambers are perfectly cleaned. In addition, since the reaction between the $ClF_3$ gas and the films or the like is a exothermic reaction, this heat generation more accelerates the reaction of the $ClF_3$ gas, so that deposits such as a film can be more effectively removed. In particular, since the $ClF_3$ gas easily reacts with tungsten, tungsten-based deposits deposited in the chambers in this embodiment can be effectively removed.

In addition, in this embodiment, since the cleaning gas is exhausted outside the chambers through the pipes of the exhaust systems of the chambers, films in these exhaust pipes, especially, in the exhaust pipes 48, in which films consisting of reaction products are easily formed, of the processing chambers 1, 2, and 3, can be removed by the cleaning gas. Since toxic gases exhausted from the exhausted systems can be removed by the toxicity-removing unit 50, clean exhaustion can be performed.

When the cleaning described above is performed, the $ClF_3$ gas is completely spread in the portions, such as the bottom surfaces of the chambers on which films or deposits cannot be removed by a method for cleaning the interiors of the chambers using a plasma of an $NF_3$ gas or the like, so that all the chambers can be perfectly cleaned. All the chambers of the multi-chamber processing apparatus as the most expecting apparatus for manufacturing a semiconductor integrated circuit element of a multilayer interconnection and having an integration level equal to or larger than that of a 64-M DRAM can be completely cleaned, and a contamination source such as particles which poses a problem in the manufacture of a semiconductor integrated circuit element having a integration level equal to or higher than that of the 64-M DRAM can be removed. In addition, although the $ClF_3$ gas is an active gas, the $ClF_3$ gas rarely corrodes the materials of the apparatus. Since the $ClF_3$ gas is a plasmaless gas, a problem that the interior of the apparatus is damaged by a plasma is not posed, thereby performing very moderate cleaning. Moreover, when the cleaning gas supply system 35 serving as a cleaning system is arranged in a conventional multi-chamber processing apparatus, and the exhaust system is slightly modified, effective cleaning can be performed at very low costs. As a matter of course, according to the method described above, a cleaning time can be made shorter than that of a method in which an operator disassembles a multi-chamber processing apparatus to clean it.

As another cleaning method, a method for cleaning the interior of a processing apparatus using a $ClF_3$ gas and a plasma thereof can be used. According to this cleaning method, a $ClF_3$ gas is supplied into the processing chamber 2, a plasma of the $ClF_3$ gas is produced in the processing chamber 2. A susceptor (not shown), electrodes (not shown), and portions therearound are cleaned by this plasma, and the $ClF_3$ gas is supplied into the processing chambers 1 and 3, the first convey chamber A, and the preliminary vacuum chambers 12 and 13, and the second convey chamber 16 through the processing chamber 2. In this manner, all the chambers of the multi-chamber processing apparatus can be cleaned. According to this method, even when a film formation process in the processing chamber 2 forms films on the inner surface of the processing chamber 2, the susceptor, and the electrodes, films deposited on the susceptor and the electrodes on which films are conspicuously formed can be effectively removed by active species in the $ClF_3$ plasma. At the same time, in all other chambers are cleaned by the $ClF_3$ gas in the same manner as described above. In this case, in each of the processing chambers 1 and 3, when a plasma is produced, a susceptor and electrodes can be cleaned by the $ClF_3$ plasma in the same manner as described above. In this case, films formed on the susceptor and the electrodes or particles deposited thereon can be removed by etching because a plasma is produced from the cleaning gas such as a $ClF_3$ gas in the processing chamber 2 without disassembling the apparatus. For this reason, a cleaning time can be shortened, and cleaning can be easily performed while the apparatus is set in an operating state.

Note that a case wherein a $ClF_3$ gas is used as a cleaning gas has been described in the above embodiment. However, this $ClF_3$ gas can be properly diluted with a nitrogen gas in accordance with the components of films and particles to be removed, and the activity of the $ClF_3$ gas can be properly adjusted.

A method in which a cleaning gas is fed from the processing chamber 2 serving as one processing chamber and then exhausted from the processing chambers 1, 2, and 3, the preliminary vacuum chambers 12 and 13, and the second convey chamber 16 has been described in the above embodiment. However, as shown in FIG. 2, cleaning may be performed as follows. That is, the flow of a cleaning gas is formed such that the cleaning gas is fed from the processing chamber 2 serving as one processing chamber and then exhausted from only the exhaust port 25. Alternatively, cleaning may be performed such that the cleaning gas is supplied from all the processing chambers 1, 2, and 3 and then exhausted from all the exhaust pipes of the processing chambers 1, 2, and 3 and the preliminary vacuum chambers 12 and 13. Moreover, the clearing gas may be supplied from the first convey chamber 4, or the cleaning gas may be supplied from all the chambers.

Cleaning for the cassette chambers 20 and 21 has not been described above. However, since the interiors of these chambers can be cleaned by an operator while the gates 26 and 27 are open, the cleaning method of the present invention need not be applied to the above cleaning. If the cleaning method of the present invention is to be applied to the cleaning for the cassette chambers 20 and 21, supply and exhaust ports for a cleaning gas need only be formed in each of the cassette chambers 20 and 21.

Another embodiment of the present invention will be described below.

Although a multi-chamber processing apparatus according to this embodiment has the same arrangement as that of the multi-chamber processing apparatus shown in FIG. 1 except for a method for supplying a cleaning gas.

Figure 7:
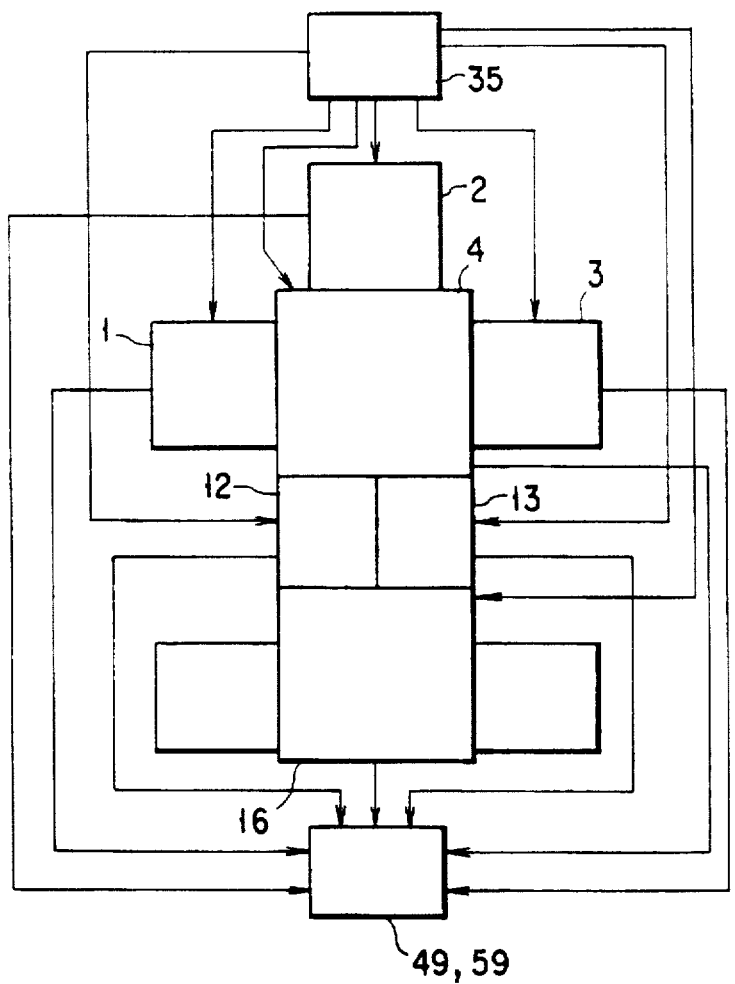
FIG. 7 is a view for explaining another embodiment of the cleaning method according to the present invention.
Figure 8:
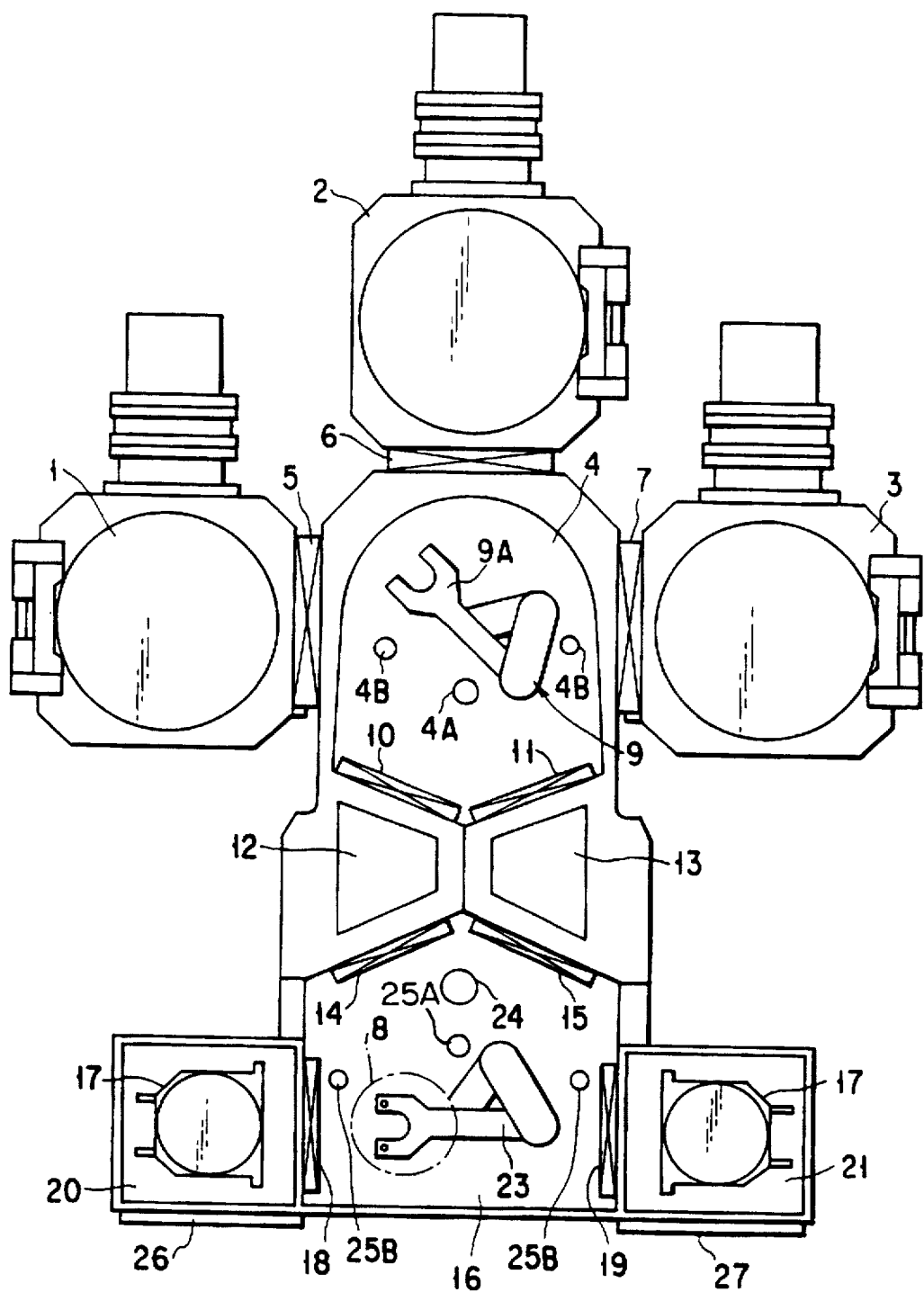
FIG. 8 is a view showing a multi-chamber vacuum processing apparatus according to another embodiment of the present invention.

More specifically, in this embodiment, after the gate valves of all the chambers of the multi-chamber processing apparatus are closed to disconnect the chambers from each other, a ClF$_3$ gas serving a cleaning gas is individually supplied from, e.g., one cleaning gas supply system to the chambers, and the ClF$_3$ gas is individually exhausted from each chamber. Meanwhile, metal-based deposits deposited inside each chamber are removed by the cleaning gas. FIG. 7 conceptually shows the flow of a cleaning gas in this case. As shown in FIG. 7, the pipe of a cleaning gas supply system 35 is branched into pipes corresponding to all the chambers of the multi-chamber processing apparatus, the branched pipes are connected to all the chambers, respectively, and a cleaning gas is individually supplied from the cleaning gas supply system 35 to all the chambers. An exhaust port is formed in each chamber, and the cleaning gas is exhausted outside the chamber from each gas exhaust port. That is, the pipes extending from the cleaning gas supply system 35 are connected to not only processing chambers 1, 2, and 3 but also a first convey chamber 4, a second convey chamber 16, and preliminary vacuum chambers 12 and 13, and the cleaning gas is individually supplied to these chambers. In order to achieve the above flow of the cleaning gas, the multi-chamber processing apparatus of this embodiment is arranged as shown in FIG. 8. More specifically, a gas supply port 4A connected to a pipe 33 extending from the cleaning gas supply system 35 and gas exhaust ports 4B connected to the exhaust systems of preliminary vacuum chambers are formed in the bottom portion of the first convey chamber 4, and a gas supply port 25A connected to the pipe 33 extending from the cleaning gas supply system 35 and a gas exhaust port 25B connected to the exhaust systems of preliminary vacuum chambers are formed in the bottom portion of the second convey chamber 16. Note that the remaining arrangement of the multi-chamber processing apparatus of this embodiment is the same as that of the apparatus shown in FIG. 1.

In the cleaning of this embodiment, a vacuum exhaust pump 49 of each of the processing chambers 1, 2, and 3 and a vacuum exhaust pump 59 or the preliminary vacuum chambers 12 and 13 are driven at room temperature higher than the boiling point of ClF$_3$, and a nitrogen gas is exhausted from the processing chambers 1, 2, and 3, the first convey chamber 4, the preliminary vacuum chambers 12 and 13, and the second convey chamber 16 to keep the degree of vacuum of each chamber. In this exhausted state, valves 39, 41, and 45 of the cleaning gas supply system 35 are opened with a predetermined degree of opening, and a mass-flow controller 40 controls the flow rate to a ClF$_3$ gas in each chamber to set the flow rate at a predetermined flow rate, e.g., 5 l/min. or less, and supplies the ClF$_3$ gas through the pipe 33. A cleaning gas is fed from a gas dispersion/supply unit 29 of the processing chamber 2 connected to the pipe 33, the gas supply port 4A of the first convey chamber 4, gas supply ports 51B and 61B of the preliminary vacuum chambers 12 and 13, and the gas supply port 25A of the second convey chamber 16 into the corresponding chambers, respectively, and the pressure of the ClF$_3$ gas in each chamber is kept at 0.1 to 100 Torr. At this time, the cleaning gas consumed in cleaning is almost exhausted by the vacuum exhaust pumps 49 and 59 or the like from exhaust ports 46 of the processing chamber 2, exhaust ports (not shown) of other processing chambers, the gas exhaust port 4B of the first convey chamber 4, the exhaust ports 51A and 61A of the preliminary vacuum chambers 12 and 13, and the gas exhaust port 25B, thereby replenishing the fresh cleaning gas. For this reason, the pressure of the cleaning gas in each chamber is kept at 0.1 to 100 Torr, and the chambers can be individually cleaned at a high efficiency by a replenished fresh cleaning gas.

In addition, since the cleaning gas supply port and the cleaning gas exhaust port are formed in each of the first and second convey chambers, the convey chambers which cannot be sufficiently cleaned by a conventional method can be completely cleaned.

The apparatus designed such that a cleaning gas is individually supplied from the single cleaning gas supply system 35 into all the chambers has been described in the above embodiment. However, a plurality of cleaning gas supply systems may be arranged, and the cleaning gas supply systems may be arranged in units of chambers. In addition, the apparatus designed such that the cleaning gas supply port and cleaning gas exhaust port are formed on the bottom surface of each of chambers except for the processing chambers has been described in the above embodiment. However, the number of cleaning gas exhaust ports and the number of exhaust ports and the positions thereof can be properly set.

Still another embodiment of the present invention will be described below.

A multi-chamber processing apparatus according to this embodiment has almost the same arrangement as that of the apparatus shown in FIG. 1. In the multi-chamber processing apparatus according to this embodiment, three processing chambers 1, 2, and 3 are arranged around the first convey chamber 4.

A processing chamber used in the multi-chamber processing apparatus of this embodiment will be described below with reference to FIG. 9. In this case, a thermal CVD unit for forming a metal film, e.g., a tungsten film is applied to the processing chamber 1. This processing chamber 1 has an almost cylindrical shape and consists of, e.g., aluminum, and the processing chamber 1 can be kept at a predetermined degree of vacuum. A first convey chamber 4 is connected to one side wall of the processing chamber 1 through a gate valve 5.

In the processing chamber 1, a susceptor 80 which consists of, e.g., aluminum, and places a wafer 8 thereon is supported by a support cylinder 81 vertically arranged from the bottom wall of the processing chamber 1. An electrostatic chuck 82 connected to a DC power supply (not shown) is arranged on the upper surface of the susceptor 80, and the electrostatic chuck 82 electrostatically attracts the wafer 8 thereon.

A portion, of the bottom surface of the processing chamber 1, opposing the lower portion of the susceptor 80 is opened, and a quartz window 83 is airtightly arranged on this opening portion. A heating halogen lamp 84 is arranged under the window 83. During a film formation process, light from the halogen lamp 84 passes through the window 83 and illuminates the lower surface of the susceptor 80, and this optical energy indirectly heats the wafer 8 to a predetermined process temperature.

An exhaust port 85 is formed in the bottom portion of the processing chamber 1, an exhaust pipe 86 is connected to this exhaust port 85, and the exhaust pipe 86 is connected to a vacuum pump 87, thereby constituting an exhaust system 88. The processing chamber 1 is evacuated by the exhaust system 88 as needed.

On the other hand, a mounting hole 91 which has, e.g., a circular shape, and is to mount a gas supply header 90 is formed in the ceiling portion of the processing chamber 1. The gas supply header 90 having a cylindrical shape and formed of, e.g., aluminum, is inserted in the mounting hole 91. A flange portion 92 is formed at the peripheral portion of the header 90, and this flange portion 92 is supported by the ceiling portion of the processing chamber 1 through an O-ring 93. In this state, the header 90 is airtightly arranged in the processing chamber 1.

A process gas supply system 100 for supplying a process gas and a cleaning gas supply system 110 for supplying a ClF-based gas such as a ClF, ClF$_3$, or ClF$_5$ gas as a cleaning gas are individually connected to the upper portion of the gas supply header 90.

Figure 9:
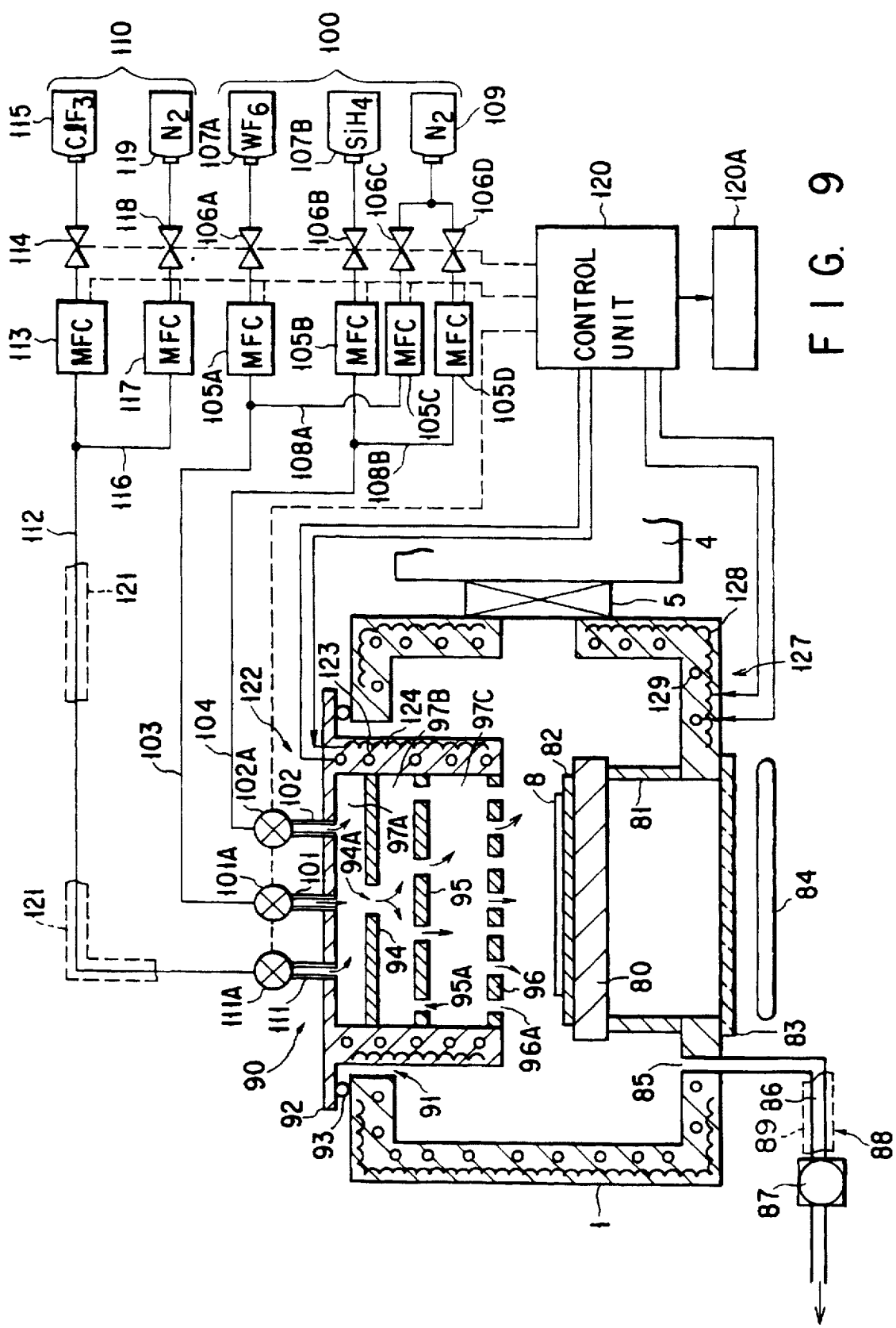
FIG. 9 is a view showing another processing chamber applied to the multi-chamber vacuum processing apparatus in FIG. 1.

In this gas supply header 90, as shown in FIG. 9, a partition plate 94, a diffusion plate 95, and a straightening plate 96 are sequentially, horizontally arranged from the upper direction. The gas supply header 90 is partitioned into three spaces 97A, 97B, and 97C.

One communication hole 94A is formed at the central portion of the partition plate 94, a plurality of diffusion holes 95A are formed and distributed in the entire surface of the diffusion plate 95. A large number of straightening holes 96A are formed and distributed in the entire surface of the straightening plate.

In this case, the diameter of each of the diffusion hole 95A is set within the range of about 0.2 to 1.5 mm, and the diffusion holes 95A are distributed at a low density. However, the diameter of each of the flow-uniforming hole 96A is set within the range of about 0.5 to 2.0 mm which is larger than that of each of the diffusion holes 95A, and the flow-uniforming holes 96A are distributed at a high density. When the diameters and distributions of the holes are changed, the pressures of the vertically arranged chambers are different from each other. For this reason, a plurality of process gases which are locally fed are uniformly mixed with each other, and uniformly supplied onto the wafer surface. Therefore, when the diameter of the wafer 8 is about 200 mm, the diameter of the straightening plate 96 is set to be a value, e.g., about 220 to 230 mm, which is slightly larger than that of the wafer 8. Note that the number of diffusion plates 95 or straightening plates 96 may be further increased such that a plurality of stages are formed by the diffusion plates 95 or the straightening plates 96.

The inner/outer surfaces of the supply header 90, the partition plate 94, the diffusion plate 95, the straightening plate 96, and the inner surface of the processing chamber 1 are subjected to a surface polishing process to prevent a ClF-based gas from being deposited on the inner/outer surfaces of the supply header 90, the partition plate 94, the diffusion plate 95, the straightening plate 96, and the inner surface of the processing chamber 1.

As a tungsten film is formed in this embodiment, the process gas supply system 100 has first and second process gas feed ports 101 and 102 connected to the gas supply header 90 for feeding two types of gases, and first and second port opening/closing valves 101A and 102A are connected to the process gas feed ports 101 and 102, respectively. First and second process gas feed pipes 103 and 104 respectively connected to the first and second process gas feed ports 101 and 102 are connected to first and second process gas sources 107A and 107B through first and second mass-flow controllers 105A and 105B and first and second opening/closing valves 106A and 106B, respectively. In this embodiment, a WF$_6$ gas is used as the first process gas, and any one of H$_2$, Si$_2$H$_4$, and Si$_2$H$_6$ gases is used as the second process gas. FIG. 9 shows a case wherein the SiH$_4$ gas is used.

Branched pipes 108A and 108B are arranged midway along the first and second process gas feed pipes 103 and 104, respectively. Third and fourth mass-flow controllers 105C and 105D and third and fourth opening/closing valves 106C and 106D are connected midway along the branched pipes 108A and 108B, respectively, and the branched pipes 108A and 108B are commonly connected to a first nitrogen source 109 serving as an inert gas source. As will be described later, a nitrogen gas serving as an inert gas is supplied from the first nitrogen source 109 during cleaning.

On the other hand, the cleaning gas supply system 110 has a cleaning gas feed port 111 connected to the supply header 90, and a cleaning gas port opening/closing valve 111A is connected to this port 111. A cleaning gas feed pipe 112 connected to the cleaning gas feed port 111 is connected to a cleaning gas source 115 through a mass-flow controller 113 serving as a flow rate adjusting valve and an opening/closing valve 114. In this manner, a ClF-based gas, e.g., a ClF$_3$ gas, serving as a cleaning gas can be supplied such that the ClF$_3$ gas is vaporized by bubbling.

A branched pipe 116 is connected midway along the cleaning gas feed pipe 112, and a second nitrogen source 119 is connected to the branched pipe 116 through a mass-flow controller 117 and a sixth opening/closing valve 118F. In this manner, the cleaning gas is diluted with a nitrogen gas from the second nitrogen source 119 as needed, so that the concentration of the cleaning gas can be controlled.

The mass-flow controllers, the opening/closing valves, and the like are controlled by a control unit 120 on the basis of a prestored program.

A ClF-based gas, e.g., a ClF$_3$ gas, used as a cleaning gas has a boiling point of about +17° C., and is liquefied when a temperature at which the cleaning gas is used is lower than the boiling point. For this reason, when the cleaning gas is to be supplied, a ClF$_3$ liquid is heated and vaporized by bubbling, and the resultant ClF$_3$ gas is supplied. However, when this gas is liquefied in the supply system, a long time is taken for restoring the supply system, and the operability of the apparatus is degraded. For this reason, in this embodiment, a liquefaction-prevention heating means 121 formed by winding, e.g., a heating tape, along the entire path of the cleaning gas feed pipe 112 is arranged around the cleaning gas feed pipe 112 to prevent the cleaning gas from being liquefied. The liquefaction-prevention heating means 121 has a temperature gradient such that the temperature gradually increases along the gas flow direction.

Figure 10:
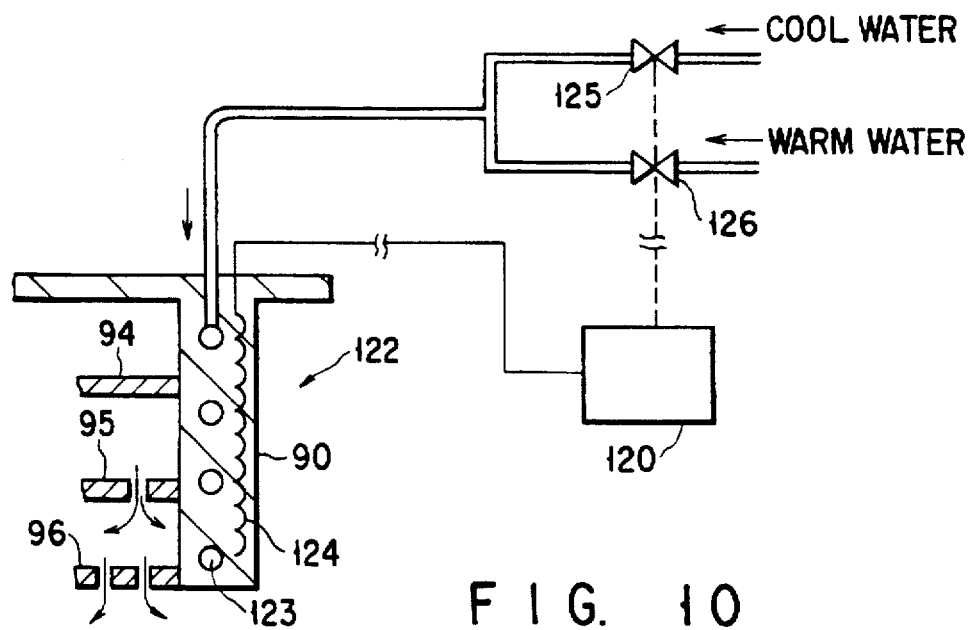
FIG. 10 is a sectional view showing a header heating means used in the processing chamber in FIG. 9.

On the other hand, although the inner wall surface of the processing chamber 1 and the inner/outer wall surfaces of the gas supply header 90 are subjected to a surface polishing process to prevent the ClF$_3$ gas being from deposited on these wall surfaces, deposition of the ClF$_3$ gas cannot be completely prevented. Therefore, in order to substantially completely prevent the deposition of the ClF$_3$ gas, a header heating means 122 is arranged in the gas supply header 90. This header heating means 122, as shown in FIG. 10, is constituted by a medium path 123 formed throughout the entire side wall of the header and a ceramic heater 124. Warm water heated to a maximum of 100° C. flows into the medium path 123. If the gas supply header 90 is to be heated to a higher temperature, the ceramic heater 124 is energized, so that the gas supply header 90 is heated to a temperature falling within the range of about 100° C. to 200° C.

The medium path 123 is constituted as follows. That is, the medium path 123 is branched on the feed-in side into two paths, i.e., a warm water path and a cool water path, and warm water or cool water can selectively flow into the medium path 123 as needed such that switching valves 125 and 126 are operated by a command from the control unit 120. In a film formation process, the header 90 is cooled by causing the cool water flow into the medium path 123, thereby preventing a film from being formed in the header 90.

In addition, a wall portion heating means 127 having the same arrangement as that of the header heating means 122 is formed in the wall portion of the processing chamber 1. This heating means 127 is also constituted by a ceramic heater 128 and a medium path 129. When the wall portion is heated by the wall portion heating means 127, film formation on the inner wall surface and deposition of the $ClF_3$ gas during cleaning can be prevented.

An exhaust pipe heating means 89 formed by winding, e.g., a heating tape, along the entire path of the exhaust pipe 86 is arranged around the exhaust pipe 86. The exhaust pipe 86 can be heated by the exhaust pipe heating means 89 during cleaning.

Note that, for each of the processing chambers 2 and 3, as for the processing chamber 1, a process gas supply system 100 and a cleaning gas supply system 110 are individually arranged. In each of the processing chambers 2 and 3, a header heating means 122 is arranged in the gas supply header 90. A wall portion heating means 127 having the same arrangement as that of the wall portion heating means 127 in the processing chamber 1 is arranged in the wall portion of each of the processing chambers 2 and 3.

In this embodiment, as in each of the above embodiments, a cleaning gas is supplied into not only the processing chambers 1 to 3, but also the first convey chamber 4, a second convey chamber 16, first and second preliminary vacuum chambers 12 and 13, and first and cassette chambers 20 and 21 to clean the multi-chamber processing apparatus. For this reason, a cleaning gas supply system and a vacuum exhaust system are connected to each of the first and second convey chambers 4 and 16, the preliminary vacuum chambers 12 and 13, and the first and second cassette chambers 20 and 21, like the processing chambers.

In addition, the multi-chamber processing apparatus according to this embodiment, a wall portion heating means 127 is arranged in the wall portion of each of the other chambers, and as shown in FIG. 11, a heater 130 is buried in each of arm portions 9A and 23A of the convey unit 9 and 23 in the first and second convey chamber 4 and 16. The heater 130 is heated during cleaning to prevent a ClF-based gas from being deposited on the arm portions 9A and 23A. These members in each chamber one formed of the above materials having high resistance to corrosion with respect to the ClF-based gas. For example, the arm portions 9a and 23A of the convey mechanisms 9 and 23 consist of Teflon (tradename).

In the present invention, since a ClF-based gas is used as a cleaning gas, portions exposed to this gas, e.g., the inner wall of the processing chamber 1, the susceptor 80, the electrostatic chuck 82, or the like, must be formed of a material having high resistance to corrosion with respect to the ClF-based gas, and the material must be used at a temperature at which the material can have the high resistance to corrosion.

As the material, polyimide, silicone rubber, or the like cannot be used. A ceramic-based material such as SiC or alumina, Teflon, silica glass (200° C. or less), carbon (300° C. or less), and the like can be used. When the electrostatic chuck is formed of the above material, e.g., silica glass, the electrostatic chuck is formed such that a conductive film is sandwiched by the quartz glass.

Materials which can be used in a ClF-based gas atmosphere are shown in Table 1.

TABLE 1

| Temperature at Which Each Material Can Have High Resistance to $ClF_3$ | |
|---|---|
| Stainless Steel 430 | to 70° C. |
| Stainless Steel 304 | to 120° C. |
| Stainless Steel 316 | to 120° C. |
| Aluminum | to 400° C. |
| Nickel | to 600° C. |
| Inconel | to 300° C. |
| Quartz | to 150° C. |
| $Al_2O_3$ | to 400° C. |
| SiC | to 300° C. |
| $ZrO_2$ | to 400° C. |
| AlN | to 400° C. |

As in the first and second convey units 9 and 23, which must use a lubricating agent because the unit has a rotary drive portion, for example, fluorine-based grease is conventionally used. However, since this grease is corroded by the ClF-based gas, the grease cannot be used. Therefore, in this case, a lubricating agent, e.g., honbring grease, having a high resistance to corrosion with respect to the ClF-based gas is used.

However, even when a material having a high resistance to corrosion with respect to the ClF-based gas is used, the susceptor 80 or the like is slightly worn/damaged by the above cleaning. Therefore, a timing at which a part such as the susceptor 80 worn/damaged by the cleaning gas must be replaced with a new one is prestored in the control unit 120 in accordance with the number of cleaning cycles. When cleaning is performed a predetermined number of times, information for instructing replacement of the part is output to a display unit 120A. More specifically, the amount of wear/damage of the part caused by one cleaning cycle is measured in advance, and the number of cleaning cycles which can be performed until the total amount of wear/damage reaches the limit of the amount of wear/damage is recognized on the basis of the amount of wear/damage of the part caused by one cleaning cycle. This number of times of cleaning is programmed in advance. Note that the number of times of cleaning cycles for replacement must be recognized in units of parts, as a matter of course.

In addition, since a ClF-based gas used as a cleaning gas is very dangerous for a human body, the ClF-based gas must be carefully handled. Therefore, in this case, gas detection mechanisms are respectively arranged in several chambers, e.g., the first and second cassette chambers 20 and 21, the first and second convey chambers 4 and 16, and the like of the multi-chamber processing apparatus. When each of the detection mechanism detects that the gas concentration of the ClF-based gas is lower than a predetermined value, these chambers are opened to the atmospheric air. In particular, such a gas detection mechanism must be arranged in each of the first and second cassette chambers 20 and 21 which may be directly, individually opened to the atmospheric air.

FIG. 12 shows a gas detection mechanism 131 arranged in the first and second cassette chambers 20 and 21. Note that each of gas detection mechanisms arranged at the other portions has the same arrangement as that of the gas detection mechanism 131. This gas detection mechanism 131 comprises a suction pipe 132 communicating with the cassette chamber 21 and a Cl gas detector 133 and an F gas detector 134 arranged midway along the suction pipe 132. When the second cassette chamber 21 is evacuated by a suction pump 135 as needed, the concentrations of a Cl gas and an F gas can be detected by these detectors. Note that the detectors 133 and 134 may be arranged in a vacuum exhaust system.

Outputs from the detectors 133 and 134 are input to a calculation unit 136 to calculate gas concentrations, and outputs from the calculation unit 136 are input to the control unit 120. Detection values from other gas detection mechanisms are input to the control unit 120. When the control unit 120 detects that the Cl gas concentrations and F gas concentrations from all the gas detection mechanisms become concentrations which are harmless to a human body, e.g., several ppm, the control unit 120 outputs an open permission signal S1 for each gate valve to a drive unit 137 in response to the detection of the control unit 120.

An actuator, e.g., an air cylinder 138, for opening/closing a gate 27 of the second cassette chamber 21 is driven by a command from the drive unit 137. In this manner, the gate 27 is opened to open the cassette chamber 21 to the atmospheric air. Note that an interlock mechanism 139 is additionally arranged to avoid an erroneous operation during an opening operation.

Note that the gas detection mechanism 131 may be arranged in not only each of the first and second cassette chambers 20 and 21 and the first and second convey chambers 4 and 16, but also each of the preliminary vacuum chambers 12 and 13 and the processing chambers 1 to 3.

In the multi-chamber processing apparatus of the embodiment, processing operations can be performed in the same manner as that of each of the above embodiments.

In this embodiment, for example, a tungsten film is formed in the processing chamber 1, the tungsten film is etched back in the processing chamber 3, and a titanium film is formed in the processing chamber 2.

In the formation of the tungsten film in the processing chamber 1, the susceptor 80 is heated by optical energy from the halogen lamp 84, and the wafer 8 placed on the susceptor 80 is kept at a predetermined process temperature. At the same time, the processing chamber 1 is evacuated by a vacuum pump 36, the first process gas from the first process gas source 107A and the second process gas from the second process gas source 107B are fed into the processing chamber 1 while their flow rates are controlled, and the internal atmosphere of the processing chamber 1 is kept at a predetermined process pressure, thereby performing the formation of the tungsten film.

In this example, a $WF_6$ gas and an $SiH_4$ gas are used as the first and second gases, and these gases are respectively diluted at predetermined concentrations with a nitrogen gas from the first nitrogen source 109 and then fed into the mixing chamber 97A on the uppermost stage of the supply header 90, or these gases are fed into the mixing chamber 97A without being diluted. These two types of process gases fed into the mixing chamber 97A are mixed with each other therein, and at the same time, fed, through the communication hole 94A of the partition plate 94, into a diffusion chamber 97B on a stage which is immediately below the mixing chamber 97A. This gas mixture is fed, through the diffusion holes 95A of the diffusion plate 95, into the straightening chamber 97C on a stage which is immediately below the diffusion chamber 97B. Thereafter, the gas mixture is uniformly supplied throughout the entire surface of the wafer through the flow-uniforming holes 96A of the straightening plate 96. In this case, since the process gases fed into the header are mixed with each other while these gases are gradually expanded in the plurality of chambers, two types of gases can be uniformly mixed with each other. In addition, since the diameter of the straightening plate 96 at the lowermost end of the header 90 is set to be slightly larger than the diameter of the wafer W, the process gas mixture can be uniformly supplied throughout the entire surface of the wafer.

When the temperature of the process gas supply header 90 or the temperature of the inner wall of the processing chamber 1 increases during a film formation process, reaction products are formed on not only the wafer surface but also the wall surface of the gas supply header 90, the inner wall surface of the processing chamber 1, or the like. In order to prevent this, during this process, a coolant consisting of cold water having a temperature of about 15° C. flows into the medium path 123 of the header heating means 122 arranged in the supply header 90 and the medium path 128 of the wall portion heating means 127 arranged in the wall portion of the processing vessel 1 to cool the supply header 90 and the wall portion of the processing chamber, thereby preventing films from being formed on the supply header 90 and the processing vessel. The same cooling operation as described above is performed in each of the processing chambers 2 and 3 during the process, thereby preventing films from being deposited on portions on which these films should not be formed.

Due to the above process, as described above, films are formed in the processing chambers, and particles are formed by these films. For this reason, cleaning is performed inside the apparatus. In this embodiment, the chambers of the multi-chamber processing apparatus may be cleaned at once, or a specific processing chamber or a specific convey chamber may be individually cleaned.

A case wherein all the chambers in the multi-chamber processing apparatus are cleaned at once will be described below.

Upon completion of a film formation process, the opening/closing valves of the process gas supply system 100 of the processing chambers 1 to 3 are closed to stop the supply of the process gases respectively supplied into corresponding processing units.

In this state, when the gate valves for airtightly closing the chambers are opened, an air flow is undesirable generated in these chambers, thereby causing, e.g., particles or the like to be scattered. For this reason, while the gate valves are kept closed, i.e., while the airtight state of each chamber is kept, an inert gas, e.g., an $N_2$ gas, individually flows into each chamber.

In order to cause the $N_2$ gas to flow into the vacuum processing chamber of each of the processing chambers 1 to 3, the $N_2$ gas is supplied from the first nitrogen source 109 (FIG. 9) in each of the process gas supply systems 100 connected to the processing chambers 1 to 3 or the second nitrogen source 119 in each of the cleaning gas supply systems 110. In addition, in order to cause an $N_2$ gas to flow into the first and second convey chambers 4 and 16, the cassette chambers 20 and 21, and the preliminary vacuum chambers 12 and 13, the $N_2$ gas is supplied from the nitrogen sources of the cleaning gas supply systems connected to these chambers.

The nitrogen gas is fed into these chambers as described above, the pressures of the chambers become equal to each other, e.g., each of these chambers becomes have an $N_2$ atmosphere equal to that of the atmospheric air. At this time, the gate valves 5, 6, 7, 19, 11, 14, 15, 18, and 19 are opened, and all the chambers of the multi-chamber processing apparatus communicate with each other to form one communicating space. The state obtained at this time is shown in FIG. 13. In this state, the gates 26 and 27 of the cassette chambers 20 and 21 are kept closed, and the cassette chambers 20 and 21 are not open to the atmospheric air.

Cleaning is performed such that a cleaning gas containing a ClF-based gas, e.g., a $ClF_3$ gas, is fed into the multi-chamber processing apparatus. In this case, as shown in FIG. 13, the cleaning gas is fed from the processing chambers 1 to 3, and the cleaning gas is diffused throughout the multi-chamber processing apparatus. The cleaning gas is exhausted outside the vacuum exhaust systems 140 of the cassette chambers 20 and 21 located on the downstream side. More specifically, a $ClF_3$ gas is generated by bubbling from the cleaning gas source 115 (FIG. 9) of each of the cleaning gas supply systems 110 connected to the processing chambers 1 to 3, and this gas is supplied from the cleaning gas feed port 111 into the process gas supply header 90 through the cleaning gas feed pipe 112 while the flow rate of the cleaning gas is controlled. This cleaning gas flows downward in the supply header 90, flows in the processing chamber 1, reacts with films and film fractions deposited on the header wall surface, the inner surface of the processing chamber, the support cylinder 81, and the like to remove these films and film fractions. The cleaning gas flows into the first convey chamber 4 through the open gate valve 5. Similarly, the $ClF_3$ gases which have flowed through the processing chambers 2 and 3 to clean the interiors of the processing chambers 2 and 3, respectively, flow into the first convey chamber 4 and merge with each other.

The $ClF_3$ gases which have flowed in the convey chamber 4 and merged with each other flow into the two preliminary vacuum chambers 12 and 13 through the gate valves 10 and 11, and flow into the second convey chamber 16 through the gate valves 14 and 15. This $ClF_3$ gas separately flows into the first and second cassette chambers 20 and 21 through the gate valves 18 and 19, and the $ClF_3$ gas is exhausted from the vacuum exhaust systems 140 such that the cassette chambers are evacuated by the vacuum exhaust systems 140.

The cleaning is performed as described above, as in each of the above embodiments, films or the like deposited on the inner wall of each of the processing chambers or the like, film fractions which are peeled, e.g., when the wafer is delivered during a convey operation of the processed wafer, and which float in the convey chambers 4 and 16, the preliminary vacuum chambers 12 and 13, and the cassette chambers 20 and 21, film particles deposited on the bottom portions of these chambers, and the like can be quickly, efficiently removed by cleaning. Therefore, the yield of semiconductor products can be considerably increased.

In this case, the flow rate of the $ClF_3$ supplied from each cleaning gas supply system is set to be, e.g., 5 l/min. or less, and the nitrogen gas from the second nitrogen source 119 of each supply system is supplied while its flow rate is controlled, thereby diluting the cleaning gas. In addition, the pressure in the apparatus during cleaning is set to be a value falling within the range of, e.g., about 0.1 to 100 Torr.

In this case, when the $ClF_3$ gas is deposited on the header, the inner wall surface of each processing chamber, the inner walls of the convey chambers 4 and 16, the preliminary vacuum chambers 12 and 13, and the cassette chambers 20 and 21, and the like, the $ClF_3$ gas separated from these wall surfaces is taken into the formed film in a film formation process performed after the cleaning process, or in a convey operation of the semiconductor wafer, thereby forming defects in this film.

Therefore, in order to prevent the $ClF_3$ gas from being deposited on the wall surfaces, the above parts are heated. More specifically, as shown in FIG. 9, warm water having a temperature of, e.g., about 80° C., serving as a heat medium flows into a medium path 123 of the header heating means 122 arranged in the supply header 90 and a medium path 129 of the wall portion heating means 127 arranged in the wall portion of the processing chamber 1, thereby heating the header 90 and the wall portion of the processing chamber 1. In this case, the ceramic heaters 124 and 128 are energized. In addition, the susceptor 80 and a portion therearound can be heated to a predetermined temperature by the halogen lamp 84 used for heating a semiconductor wafer. At this time, a cleaning temperature is set to be a temperature falls within a range of, e.g., 17° C., which is the boiling point of the $ClF_3$ gas, to 700° C.

During the above cleaning process, heating in the remaining processing chambers 2 and 3 and other chambers such as convey chambers is performed in the same manner as described above. In addition, the heaters 130 arranged in the arm portions 9A and 23A heat the convey units 9 and 23 of the convey chambers 4 and 16 to a temperature falling within the above predetermined temperature range.

In this case, a heating temperature is set to be a temperature falling within a range set such that materials used in the apparatus are not corroded with the $ClF_3$ gas, as a matter of course.

In this manner, since the supply headers, the wall surfaces of the processing chambers, and the wall surfaces of the convey chambers, the preliminary vacuum chambers, the cassette chambers, and the like are heated during a cleaning operation, no cleaning gas is deposited on the wall surfaces of these chambers. Therefore, in a film formation process restarted after the cleaning operation is completed, a $ClF_3$ gas which causes defects in the formed film is not taken into the film, and a yield can be considerably increased.

In this cleaning operation, the cleaning gas is partially exhausted by the exhaust system 88 connected to each processing chamber. In this case, the exhaust pipe 86 is entirely heated by the exhaust pipe heating means 89. In this manner, films deposited on the inner wall of the exhaust pipe 86 during the film formation process can be efficiently removed, and, therefore, cleaning of the processing chambers and cleaning of the exhaust systems can be simultaneously performed. In particular, since the exhaust pipe 86 is heated to a temperature, e.g., about 50° to 200° C., higher than room temperature, films formed by depositing the cleaning gas can also be efficiently removed.

In each of the processing chambers 1 to 3, when the cleaning gas flows, a nitrogen gas serving as an inert gas from the first nitrogen source 109 arranged in the process gas supply system 100 is simultaneously supplied into the gas supply header 90 thorough both the first and second process gas feed pipes 103 and 104, in this case, the supply pressure of the nitrogen gas is set to be slightly higher than the supply pressure of the cleaning gas not to cause the cleaning gas to reversely flow into the first and second process gas feed ports 101 and 102. In this manner, when an inert gas flows into each of the process gas supply systems 100 during the cleaning process, the cleaning gas is prevented from reversely flowing from the first and second process gas feed ports 101 and 102 into the process gas feed pipes 103 and 104, thereby preventing the cleaning gas from being deposited on the inner surface of the process gas feed pipes 103 and 104. Therefore, with the above arrangement, the ClF$_3$ gas is not taken into the film formed in the film formation process restarted upon completion of a cleaning process, and the headers and wall portions are heated, thereby further increasing a yield.

When the cleaning process is performed as described above, the ClF-based gas removes unnecessary films and slightly reacts with parts such as the susceptor due to the very high reactivity of the ClF-based gas. Therefore, these parts are worn by the ClF-based gas.

In this case, as described above, a program for outputting an instruction for replenishing expendable supplies or replacing constituent parts with new ones when a cleaning operation is performed a predetermined number of times is incorporated in the control unit 120 for controlling the operation of the entire apparatus.

Therefore, when the cleaning operation is performed the predetermined number of times, the control unit 120 outputs a command for replenishing a corresponding expendable supply or replacing a corresponding constituent part with a new one, and this command is displayed on the display unit 120A.

The number of cleaning cycles for replacement or replenishment generally varies depending on expendable supplies or constituent parts, and the number of cleaning cycles is individually determined. In order to determine the number of cleaning circuits for replacement, the amounts of wear and damage of each part caused by one cleaning cycle are measured, and the number of cleaning cycles performed until the part has the limits of the amounts of wear and damage is determined on the basis of the measurement values.

For example, the control unit 120 has a program formed to output a replacement command for replacing the susceptor 80 and the support cylinder 81 serving as constituent parts with new ones when the cleaning operation is performed 50 to 200 times.

The amount of wear/damage caused by one cleaning cycle is calculated in advance, and a timing at which an expendable supply or a constituent part must be replenished or replaced with a new one is recognized on the basis of the amount of wear/damage caused by one cleaning cycle. For this reason, each member can be replaced with a new one at an appropriate timing Therefore, unlike a conventional technique, a process of checking the degree of wear/damage can be omitted, and the maintenance/management of the apparatus can be efficiently performed. For this reason, the operating efficiency and throughput of the apparatus can be increased.

In addition, when this method is applied to a multi-chamber processing apparatus, the amount of wear/damage can be checked without stopping the operation of the apparatus itself. For this reason, the operating efficiency of the entire apparatus considerably increases, and the throughput of the apparatus further increases.

In particular, when the above processing method using a ClF$_3$ gas is applied to a cluster apparatus for improving mass production of semiconductor devices, productivity can be largely increased by considerable shortening a time required for periodical maintenance, thereby obtaining a great effect.

In the future, with progress of the FA of a semiconductor factory or an unmanned factory, a cleaning technique becomes more important. For this reason, the cleaning method described above can contribute to realization of a semiconductor factory having a high productivity.

Figure 14:
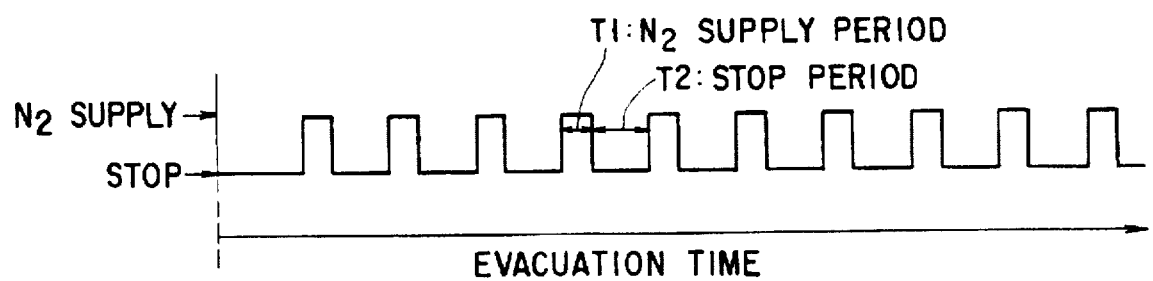
FIG. 14 is a view for explaining a manner of supplying an inert gas into the vacuum processing apparatus upon completion of cleaning.

Upon completion of the cleaning operation as described above, the ClF$_3$ gas left in each chamber must be reliably exhausted for a film formation process performed after the supply of the cleaning gas is stopped. For this reason, the exhaust system 88 is continuously driven, supply and stop operations of an inert gas, e.g., a nitrogen (N$_2$) gas are repeated a plurality of times. More specifically, while the exhaust system 88 of each chamber is maximally driven to evacuate a corresponding one of the chambers, the supply and stop operations of the N$_2$ gas serving as an inert gas are repeated a plurality of times (in this case, 10 times) as shown in FIG. 14. At this time, a stop period T1 of the N$_2$ gas is set to be, e.g., about 10 to 30 seconds, and a stop period T2 is set to be, e.g., about 30 to 60 seconds.

At this time, the N$_2$ gas is supplied from the nitrogen source of a process gas supply system or a cleaning gas supply system in each processing chamber such that opening/closing valves are fully open. In each of convey chambers, preliminary vacuum chambers, and cassette chambers, the N$_2$ gas is supplied from the nitrogen source of the cleaning gas supply system.

While the chambers are continuously evacuated, the supply and stop operations of the N$_2$ gas are repeated. For this reason, the ClF$_3$ gas deposited on the inner wall of each chamber can be removed by shock generated when the supply and stop operations of the N$_2$ gas are repeated, and the remaining ClF$_3$ gas can be almost completely removed from the chamber. Therefore, the ClF$_3$ gas can be prevented from being taken into a film during a film formation process performed after the cleaning operation, and the yield of products can be further increased. In this case, the number of times of repetition of the supply and stop operations of the N$_2$ gas is not limited to ten, and the number of times may be appropriately set. In addition, in order to effectively remove the ClF$_3$ gas by shock generated when the N$_2$ gas is supplied, the supply of the N$_2$ gas is preferably started when the pressure in each chamber becomes, e.g., about $1 \times 10^{-3}$ Torr.

When the multi-chamber processing apparatus is to be opened to the atmospheric air, the supply and exhausting of the N$_2$ gas are repeated after the supply of the cleaning gas is stopped. The gas detection mechanism 131 arranged in each chamber recognizes that the gas concentration in a corresponding one of the chambers is lower than a reference value, safety is confirmed. The multi-chamber processing apparatus is then opened to the atmospheric air.

More specifically, as shown in FIG. 12, the atmosphere in, e.g., an atmosphere in the cassette chamber 21 is reset through the suction pipe 132 by driving the suction pump 135, and the Cl gas detector 133 and the F gas detector 134 arranged midway along the suction pipe 132 detect corresponding gas concentrations, respectively. The detection results are transmitted to the calculation unit 136 to calculate the gas concentrations.

Each calculated gas concentration is input to the control unit 120, and gas concentrations from other gas detection means are input to the control unit 120. When the control unit 120 determines that all the Cl and F gas concentrations from the gas detection mechanisms become predetermined safety reference values or less, the control unit 120 outputs an open permission signal S1 to the drive unit 137. When the drive unit 137 receives an open signal S2, the drive unit 137 drives the air cylinder 138 to open the gate 27, thereby opening the apparatus to the atmospheric air. In this case, since the inter-lock mechanism 139 is arranged to prevent an erroneous operation, when the drive unit 137 receives the open signal S2 without receiving the open permission signal S1, the air cylinder 138 is not operated, and the gate 27 is not opened. When the air cylinder is not operated by an interlocking operation as described above, a buzzer unit (not shown) for making a buzzer sound or the like to call the attention of operators may be arranged.

As described above, when the multi-chamber processing apparatus is to be opened to the atmospheric air after a cleaning operation is performed, the multi-chamber processing apparatus is opened to the atmospheric air when it is confirmed that cleaning gas contents in the atmospheric gas in the apparatus represent safety values or less. For this reason, the dangerous $ClF_3$ gas can be safely handled.

In particular, when the gas detection mechanism 131 for detecting the concentration of a ClF-based gas is arranged in at least chambers, which may be directly, individually opened to the atmospheric air, i.e., the cassette chambers 20 and 21 in this embodiment, considerably enhanced safety can be obtained.

Note that the control unit 120 is preferably programmed such that the above cleaning operation is automatically executed each time a predetermined number of wafers are processed. For example, each time a predetermined number of wafers, e.g., 1 lot (25 wafers), are processed in the processing chambers 1 to 3, the entire apparatus assembly is automatically cleaned by the method described above. In this case, the number of wafers to be processed is not limited to 25, and the number is determined depending on the degree of a film formation amount. In this case, a degree of film formation for a specific portion on which the film need not be formed in one film cycle is acquired as data, and the number of wafers corresponding to a cleaning frequency is determined on the basis of the degree of film formation.

In addition, in the above embodiment, the entire multi-chamber processing apparatus is cleaned at once. However, the present invention is not limited to this embodiment. For example, as shown in FIG. 13, the following method may be used. That is, only the gate valve 5 is closed to set the first chamber 1 to be an airtight chamber, a normal film formation process, e.g., a film formation process for a tungsten film is performed in the processing chamber 1, and at the same time, the processing chambers 2 and 3, the convey chambers, the preliminary vacuum chambers, the cassette chambers, and the like are cleaned. In this manner, only the processing film having an inner wall on which a large amount of unnecessary film is deposited can be individually cleaned, the operating efficiency of the entire apparatus can be increased, and the throughput of the apparatus can be considerably increased. The above selective cleaning can be performed in any of processing chamber.

In addition, in the above embodiment, the chambers are set to communicate with each other and cleaned with a $ClF_3$ gas having the same concentration or the same dilution rate. The present invention is not limited to this embodiment. A cleaning operation may be performed such that the concentration of the $ClF_3$ gas is set to be an optimal value in accordance with the deposition amount of an unnecessary film in each chamber or the degree of contamination caused by film fractions or the like in each chamber.

Since the etching rate of a formed film is generally proportional to the concentration of a $ClF_3$ gas, the $ClF_3$ gas temperature is set to be high in a chamber and, particularly, a processing chamber, in which the deposition amount of an unnecessary film is large, while the $ClF_3$ gas concentration is set to be low in a convey chamber or a cassette chamber. In this case, the $ClF_3$ gas concentration can be controlled by changing the supply amount of an inert gas.

Figure 15:
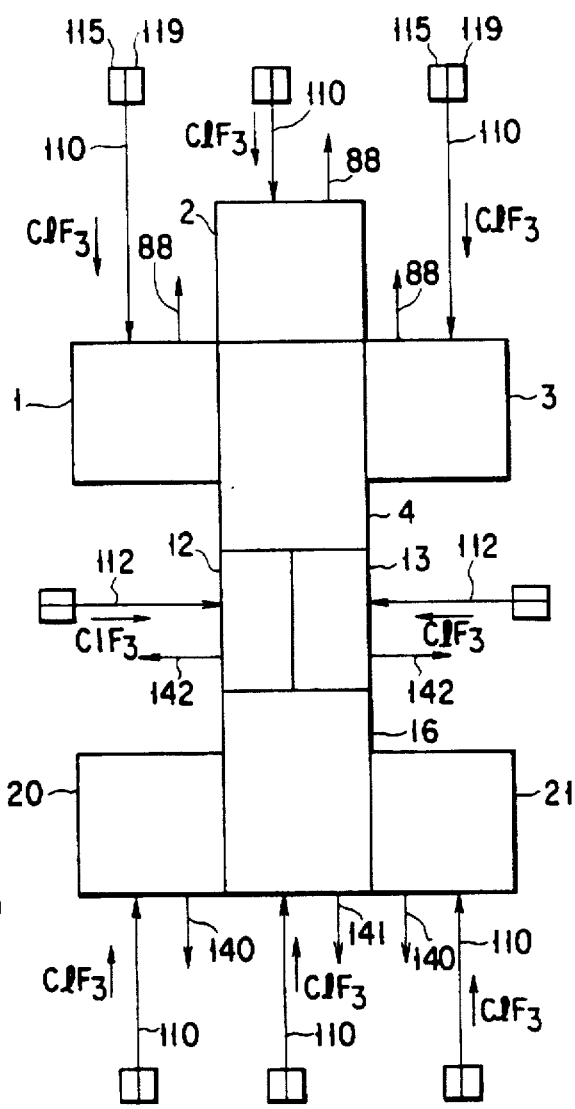
FIG. 15 is a view for explaining still another embodiment of a method for cleaning a multi-chamber vacuum processing apparatus.

The state obtained at this time is shown in FIG. 15.

More specifically, during a cleaning process, the gates 26 and 27 and the gate valves 5, 6, 7, 10, 11, 14, 15, 18, and 19 are closed, and each chamber is individually set in an airtight state. In this case, if the same $ClF_3$ gas concentration is set in a plurality of chambers, the gate valves therebetween may be opened to cause these chambers to communicate with each other. That is, the gate valves are selectively opened/closed to form a plurality of spaces in the apparatus, and $ClF_3$ gas concentrations are set in units of spaces.

While the vacuum exhaust systems 88, 140, 141, and 142 which are respectively arranged for the chambers are driven to evacuate these chambers, a cleaning gas containing $ClF_3$ flows from the cleaning gas source 115 (FIG. 9) of each of the cleaning gas supply systems 110 respectively arranged for the chambers. In this case, an inert gas, i.e., an $N_2$ gas, for diluting the cleaning gas flows from the second nitrogen source 119 arranged adjacent to the cleaning gas source 115 to cause the control unit 120 to set an optimal $ClF_3$ gas concentration for a corresponding chamber.

In this manner, a cleaning process can be performed to each chamber with a $ClF_3$ gas whose concentration is optimally set. Therefore, a cleaning process is not excessively or insufficiently performed, and a cleaning process can be optimally performed to the chambers at once. A cleaning time is shortened, thereby further improving the cleaning efficiency.

Since the concentration of the $ClF_3$ gas is determined in consideration of the resistance to corrosion of the members used in a chamber subject to be a cleaning process, the members can be protected from corrosion.

Evaluation results of effectiveness of a $ClF_3$ gas of gases containing F and Cl and used as cleaning gases in the present invention will be described below.

The characteristic feature of $ClF_3$ is a low Cl-F bond energy, i.e., 253.6 kJ/mol. That is, this feature means that active reaction species can be generated by only thermal energy in the absence of a plasma. The physical properties of $ClF_3$ are shown in Table 2.

TABLE 2

| Molecular Weight | 92.45 |
| --- | --- |
| CAS No. | 7790-91-2 |
| Melting Point | −76.3° C. |
| Boiling Point | 11.75° C. |
| Critical Temperature | 174° C. |
| Critical Pressure | 57 atm |
| Heat of Fusion | 1819.3 cal/mol |
| Heat of Evaporation | 6580 cal/mol |
| $\Delta H°_{298}$ | −37.97 cal/mol |
| $\Delta G°_{298}$ | −28.41 cal/mol |
| $\Delta S°_{298}$ | 67.3 cal/mol · deg |
| $CP°_{298}$ | 15.28 cal/mol · deg |

Although it depends on the film formation temperature of a film formation apparatus, when a hot-wall type vertical batch CVD apparatus is used, a film formation temperature is generally, set to be a temperature of 500° C. or more, e.g., 620° C. For this reason, when a $ClF_3$ gas is used as an etching gas, a special thermal energy need not be applied. This is a great merit.

In addition, since the $ClF_3$ gas is a liquefied gas, this gas must be carefully handled. However, this is not a serious problem because a liquefied gas which is dichlorosilane is generally used in a silicon nitride film process.

Figure 16:
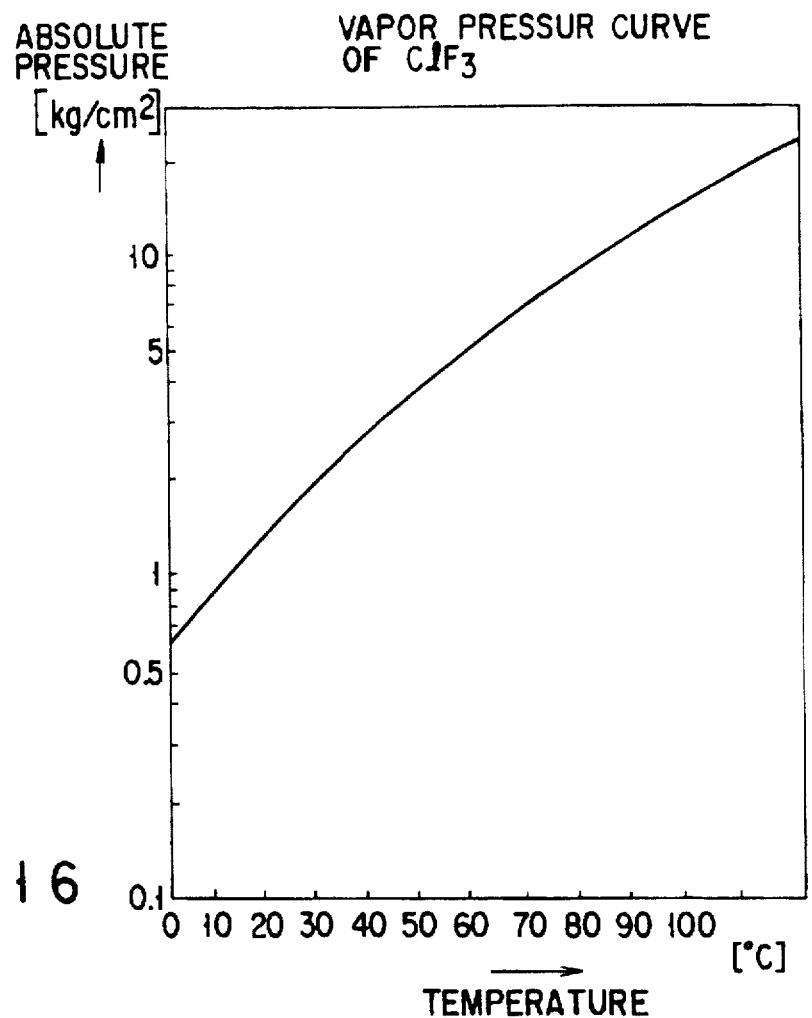
FIG. 16 is a graph showing the vapor pressure curve of $ClF_3$.

FIG. 16 shows the vapor pressure curve of $ClF_3$. According to this curve, a vapor pressure at a temperature of about 13° C. is 1 kg/cm$^2$, and $ClF_3$ is liquefied at room temperature.

The etching rates of the ClF$_3$ gas with respect to reaction film species were examined. The results are shown in Table 3 and FIGS. 17 and 18.

Figure 19A:
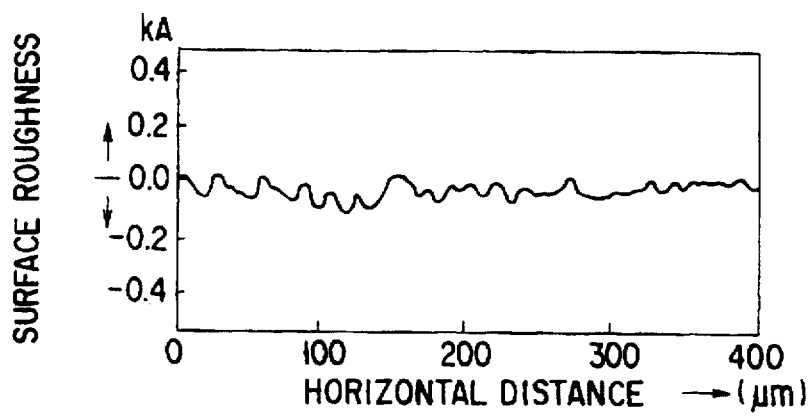
FIGS. 19A and 19B are graphs showing the surface roughnesses of a wet cleaning test sample before and after an examination.
Figure 19B:
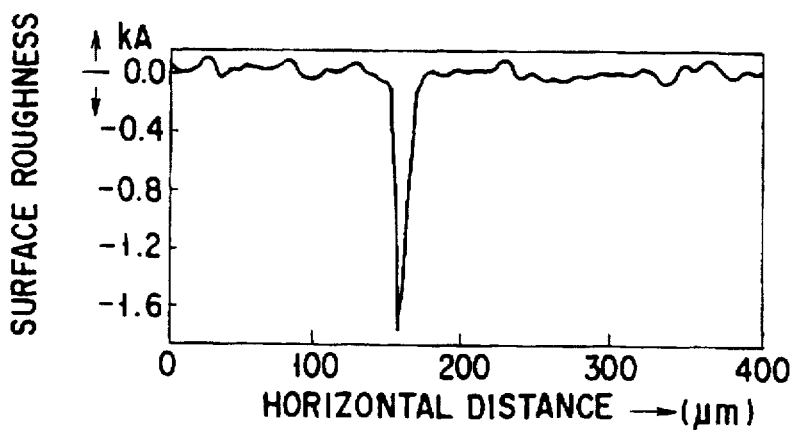

The results are shown in FIGS. 19A to 19D. FIGS. 19A and 19B show the surface roughnesses of the wet cleaning test sample before and after the test is performed, respec-

TABLE 3

| Item | ClF$_3$ Gas Cleaning | | Present Wet Washing | |
| --- | --- | --- | --- | --- |
| | Polysilicon | Si$_3$N$_4$ | With Replacement | Without Replacement |
| Heat Temperature Rise/Fall Time | not required | not required | 5 hours | 5 horus |
| Tube Replacing Time | not required | not required | 40 minutes | 40 minutes |
| Cleaning Time | 3 hours and 40 minutes | 1 hour and 30 minutes | 0 hour | 13 hours |
| Reassembling Time | not required | not required | 1 hour | 1 hour |
| Heater Profile | 1 hour | 1 hour | 1 hour | 1 hour |
| Leakage Check | not required | not required | 3 hours | 3 hours |
| Number of Operators | one (one) | one (one) | one (two) | one (two) |
| Total | about 4 hours and 40 minutes | about 2 hours and 30 minutes | about 10 hours and 40 minutes | about 24 hours |

Figure 17:
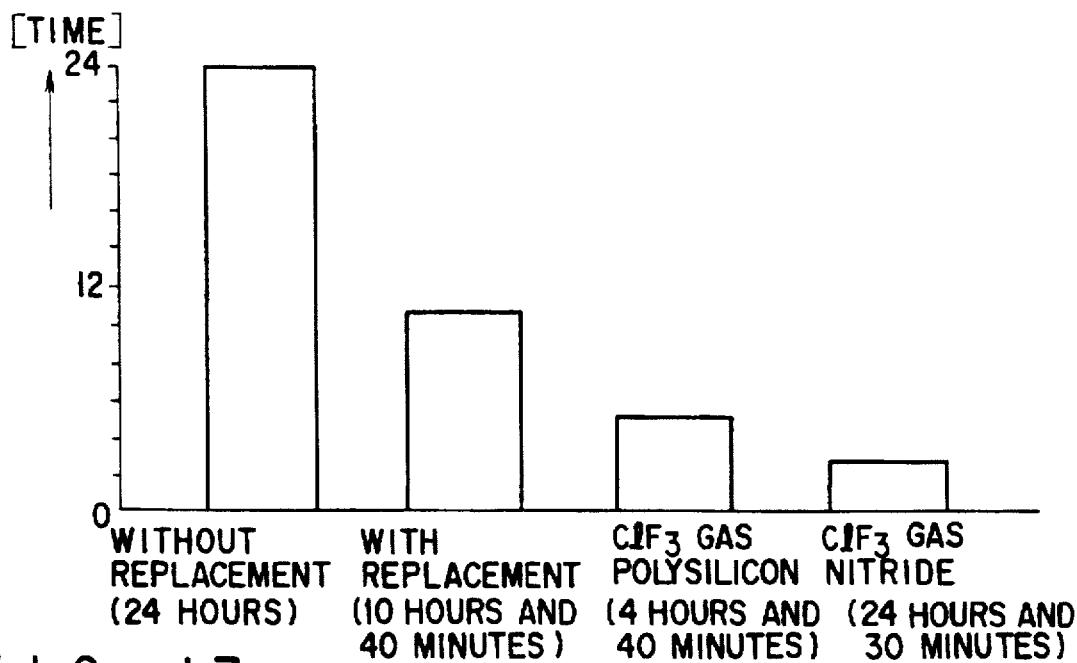
FIG. 17 is a graph for comparing total times required for wet cleaning and $ClF_3$ cleaning with each other.

Table 3 shows times required for performing operations described in items during a cleaning/maintenance process. FIG. 17 shows a total time required for performing the cleaning operations shown in Table 3. As shown in FIG. 17, it is confirmed that a cleaning operation using a ClF$_3$ gas could be performed within a time much shorter than that of a conventional wet cleaning operation.

Figure 18:
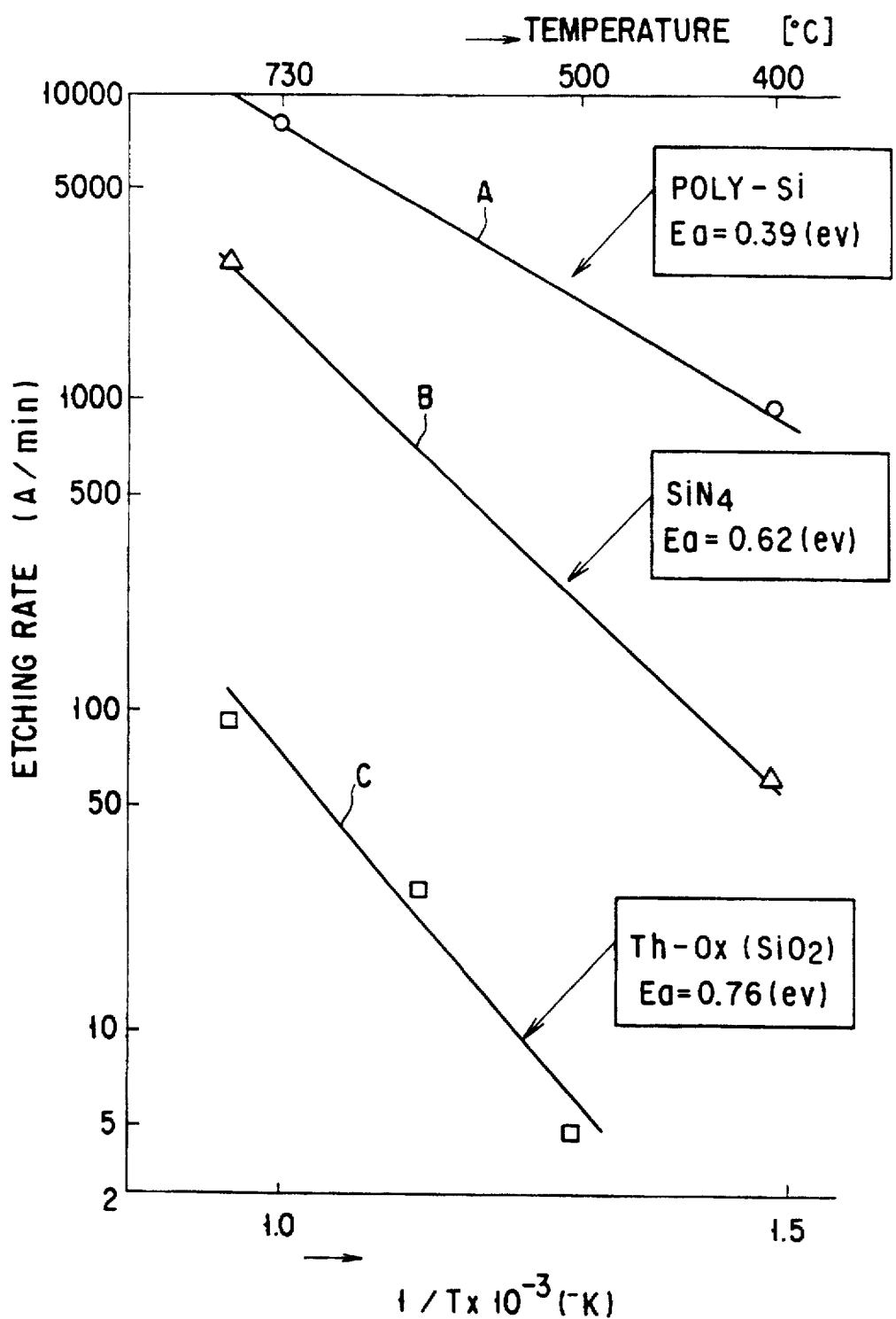
FIG. 18 is a graph showing the etching rates of various films formed using a $ClF_3$ gas.

FIG. 18 shows the etching rates of the ClF$_3$ gas with respect to polysilicon (Poly-Si) formed by a CVD method (LP-CVD method) using a vertical thermal processing furnace, a silicon nitride film (SiN$_4$), and a thermal oxide film (SiO$_2$) (Th-Ox) formed by an oxidation furnace.

Although it depends on temperatures, each of an etching rate of the polysilicon indicated by a curve A and an etching rate of the silicon nitride film indicated by a curve B is 10 to 100 times that of the thermal oxide film at a temperature generally used in the LP-CVD, i.e., 500° C. or more. In contrast to this, a sufficient etching rate of the thermal oxide film (SiO$_2$) indicated by a curve C cannot be obtained. Therefore, it was confirmed that a sufficiently large selectivity ratio between the etching rate of the thermal oxide film and the etching rates of the polysilicon and silicon nitride film could be obtained.

Therefore, when the ClF$_3$ was used, damage to quartz generally used as the material of a reaction tube of a hot-wall type LP-CVD could be minimized, as is apparent from the graph shown in FIG. 18.

Evaluation for damage of the ClF$_3$ gas to the quartz reaction tube will be described below.

Damage to quartz obtained when a gas cleaning method performed by causing a gas to flow was compared with a conventional wet cleaning method was evaluated. An evaluation procedure and evaluation results will be described below.

As the evaluation procedure, quartz test samples were put into two quartz reaction tubes, respectively, and film formation was performed by CVD using these quartz reaction tubes under the same conditions. In one of the quartz reaction tubes, a ClF$_3$ cleaning gas flowed while the process temperature was kept, and then the surface roughness of the test sample was measured.

Figure 19C:
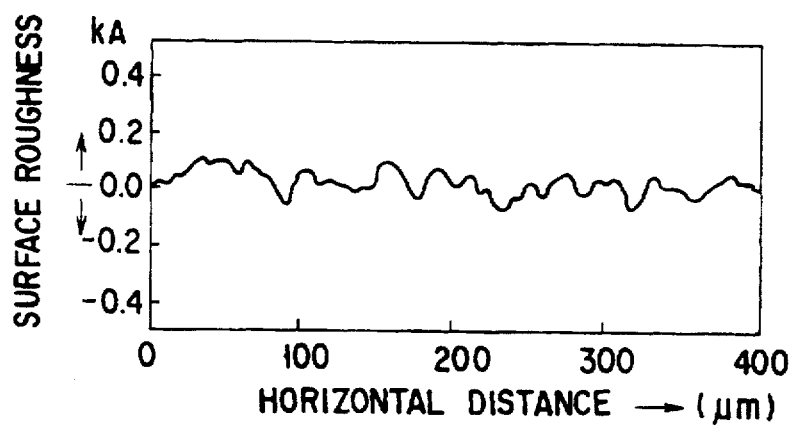
FIGS. 19C and 19D are graphs showing the surface roughnesses of a $ClF_3$ gas cleaning test sample before and after a test.
Figure 19D:
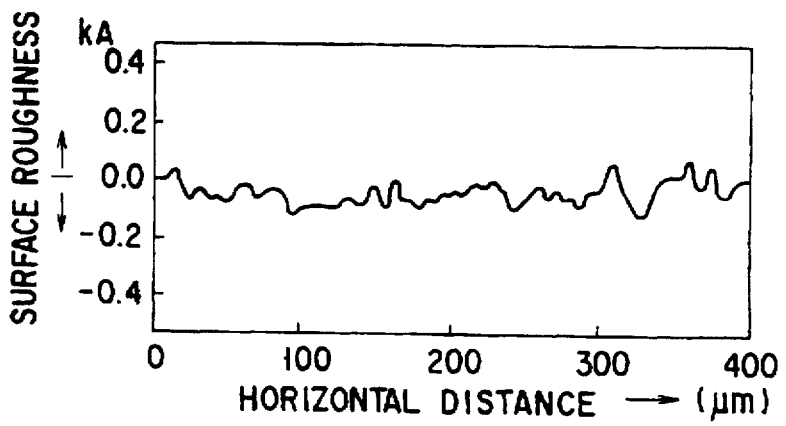

In the other quartz reaction tube, the temperature was slowly increased to room temperature after the film formation, the quartz test sample was subjected to a conventional wet cleaning process, and then the surface roughness of the test sample was measured.

tively. FIGS. 19C and 19D show the surface roughnesses of the gas cleaning test sample before and after the test is performed, respectively.

In the wet cleaning method, as indicated by a point P1 in FIG. 19B, micro-cracks were formed in the quartz surface. However, in the ClF$_3$ gas cleaning method, as shown in FIG. 19D, it was confirmed that a surface roughness almost equal to the surface roughness before film formation could be obtained.

The cracks were formed in the wet cleaning method due to the following reason. That is, since the linear expansion coefficient of a CVD film is different from that of quartz, micro-cracks may be formed in the quartz surface while the temperature is decreased to room temperature. When these invisible micro-cracks overlap, the quartz reaction tube may be destroyed during evacuation.

Therefore, it is derived that a ClF$_3$ gas cleaning process which is performed in a temperature range near the reaction temperature, i.e., which is performed without a large change in temperature is very effective as a method for minimizing damage to a quartz reaction tube.

Particle evaluation for the ClF$_3$ gas cleaning will be described below.

Since the particle evaluation was performed after the etching conditions of the ClF$_3$ gas cleaning were optimized, the results are shown as follows. This evaluation was performed such that film formation and ClF$_3$ gas cleaning were repeated in the same quartz reaction tube.

FIG. 20 shows an evaluation procedure, and FIG. 21 shows the results obtained by the evaluation procedure.

In this evaluation procedure, as shown in FIG. 10, a quartz reaction tube is wet washed with HF (ST1). Thereafter, an N$_2$ idle sequence is performed to a bare wafer, and a particle check is performed twice (ST2).

A 1-μm polysilicon film is precoated on this wafer (ST3), and a particle check for the surface of the wafer is performed twice (ST4). In addition, a 9-μm polysilicon film is formed on the wafer (ST5), and a particle check for the surface of the resultant wafer is performed twice (ST6).

A cleaning process using a ClF$_3$ gas is performed (ST7), and a particle check for the resultant wafer is performed four times (ST8). The control flow returns from ST8 to ST3 to repeat the same operations as described above a plurality of times, e.g., four times.

The results are shown in FIGS. 21A and 21B. The number of particles conspicuously increases after the wet washing, film formation, and ClF$_3$ gas cleaning, and the number of particles is an optimal value.

Therefore, when the present invention is to be used in a mass-production factory, it is found that only ClF$_3$ gas cleaning can be continuously performed without performing wet cleaning.

The evaluation for contamination will be described below.

In a conventional technique, an etching gas is not fed into a CVD reaction chamber due to the following reasons. That is, a stainless steel manifold in a reaction tube may be corroded with ClF$_3$, and a wafer may be contaminated by chlorine (Cl) and fluorine (F) left in the reaction tube.

The evaluation for contamination caused by using a ClF$_3$ gas as a cleaning gas was performed.

As an evaluation procedure performed in this case, a 1-μm polysilicon film is formed on a bare wafer stored in a reaction tube to form a sample A, and a cleaning process is performed in the reaction tube with a ClF$_3$ gas.

After this cleaning process is performed, a 1-μm polysilicon film is formed on a new bare wafer to form a sample B. Note that, in this film formation process, a 1-μm film is deposited on the inner wall of the film formation tube.

In addition, a 1-μm polysilicon film is formed on a new bare wafer using the reaction tube in which the film is deposited, thereby forming a sample C.

When these samples A, B, and C were subjected to an element analysis using an SIMS (Secondary Ion Mass Spectrometer), the results shown in FIGS. 22A to 22C and FIGS. 23A to 23C were obtained.

Figures 23A, 23B, 23C:
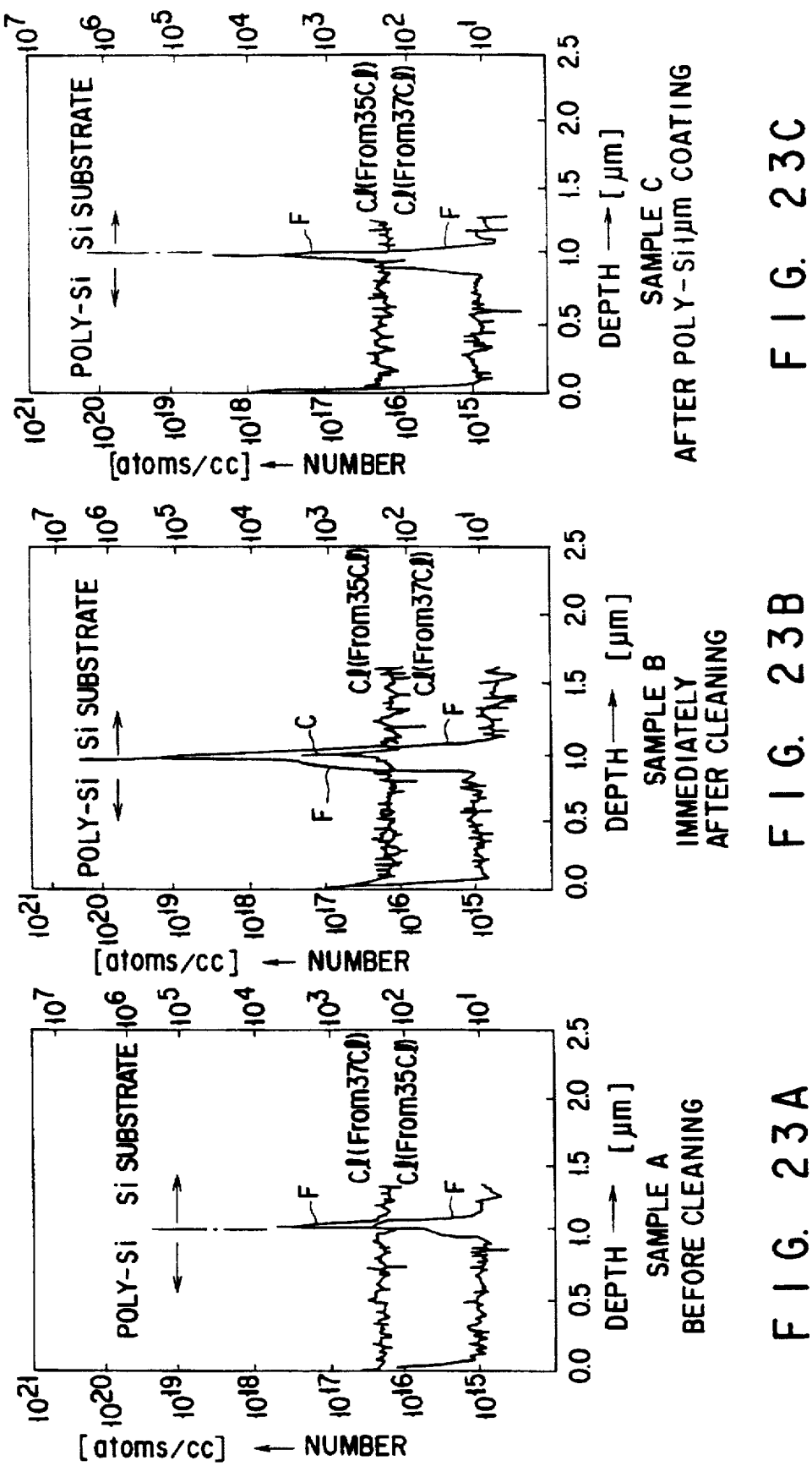
FIGS. 23A to 23C are graphs showing results obtained by contamination evaluation of Cl and F.

FIGS. 22A to 22C are graphs showing the evaluation for contamination of Fe. FIG. 22A shows the sectional profile of the sample A, FIG. 22B shows the sectional profile of the sample B, and FIG. 22C shows the sectional profile of the sample C. In addition, FIGS. 23A to 23C are graphs showing the evaluation of contamination caused by Cl and F. FIG. 23A shows the sectional profile of the sample A, FIG. 23B shows the sectional profile of the sample B, and the FIG. 23C shows the sectional profile of the sample C.

According to the results shown in FIGS. 22A to 22C, the following fact was found. That is, each of the Fe contents of the samples A, B, and C was smaller than a reference value, and any problem with respect to iron (Fe) serving as a main component of stainless steel was not posed. More specifically, since the ClF$_3$ gas was a liquefied gas, when the gas was absorbed in the manifold surface, the manifold surface might be contaminated by moisture flowing into the manifold when the furnace port was opened. However, it was found that any problem was not posed.

A problem that a wafer is contaminated by remaining chlorine (Cl) and fluorine (F) will be considered. That is, as shown in FIGS. 23A to 23C, the formed films do not contain chlorine (Cl) or fluorine (F), and at least, these contents are equal to or smaller than the detection lower limit value of the SIMS (mass spectrometer). In this evaluation, the peak values of chlorine (Cl) and fluorine (F) are observed at the interface between a polysilicon substrate and a polysilicon film. Immediately after a cleaning process is performed, these peak values are especially large (FIG. 23B).

However, even when the gas cleaning process is compared with a wet cleaning process by the same evaluation method, in either process, the surface concentration of an impurity (Cl and F) at the interface between the silicon substrate and the polysilicon film is maximum immediately after a cleaning process is performed.

A reason why a peak value appears at the interface is as follows. That is, although the wafer to be evaluated used in this case is subjected to diluted hydrofluoric acid washing and hydrochloric acid washing as preprocesses, when these preprocesses are performed, chlorine (Cl) and fluorine (F) are always absorbed in the uppermost surface of the wafer.

A large number of wafer washing processes are performed in the semiconductor manufacturing processes. In this case, chlorine or fluorine is always absorbed in to the uppermost surface of the wafer. However, according to the actual results which have been obtained, it is known that chlorine or fluorine absorbed in a wafer at the levels shown in FIGS. 23A to 23C does not pose any problem.

The above results are results obtained in the vertical thermal processing furnace using a quartz process tube. This tendency is not limited to the above case, and the same tendency as described above can be obtained in a processing apparatus using a material having high resistance to corrosion with respect to the ClF$_3$. Therefore, the effectiveness of ClF$_3$ cleaning can be obtained.

According to the above results, it is recognized that effective production can be performed without causing the quality degradation of a wafer by applying ClF$_3$ gas cleaning to a multi-chamber apparatus.

As has been described above, according to the present invention, since a multi-chamber processing apparatus can be cleaned with a plasmaless gas without disassembling the multi-chamber processing apparatus, a throughput and a yield considerably increase. Therefore, the present invention can cope with micropatterning and high integration of a 256-M RAM or the like.

In each of the above embodiments, cleaning of a metal tungsten film has been described. However, a film to be cleaned is not limited to the metal tungsten film, and the above cleaning can be applied to MoSi$_2$, WSi$_2$, TiN, TiW, Mo, SiO$_2$, Poly-Si, or the like. As a process gas, a gas corresponding the film formation of each of the above films is used. For example, when a tungsten film is to be formed, in addition to a combination of WF$_6$+SiH$_4$, a combinations of WF$_6$+H$_2$ or WF$_6$+Si$_2$H$_6$ is used. When a WSix film is to be formed, a combination of WF$_6$+SiH$_4$, a combination of WF$_6$+Si$_2$H$_6$, a combination of WF$_6$+SiH$_2$Cl$_2$, or the like can be used.

In addition, an inert gas to be used is not limited to an N$_2$ gas. Another inert gas, e.g., He, Ar, Xe, or the like can be used.

The present invention can be applied to not only the above CVD apparatus but also a sputtering apparatus, a diffusion apparatus, or the like. As a target object to be processed, not only a semiconductor wafer but also an LCD substrate or the like can be used.

What is claimed is:

1. A vacuum processing apparatus comprising:
   a plurality of vacuum processing chambers for processing a target object using a process gas;
   a vacuum convey chamber, connected to said plurality of vacuum processing chambers, for loading and unloading the target object into and from said processing chambers in a vacuum atmosphere;
   opening and closing means for opening and closing a path between said plurality of vacuum processing chambers and said vacuum convey chamber; and
   cleaning gas supply means for supplying a cleaning gas containing ClF$_3$ into at least one of said vacuum convey chamber and said vacuum processing chambers;
   wherein the cleaning gas is supplied into said plurality of vacuum processing chambers and said vacuum convey chamber communicating with each other by opening said opening and closing means to clean said plurality of vacuum processing chambers and said vacuum convey chamber;

the vacuum processing apparatus further including a preliminary vacuum chamber connected to said vacuum convey chamber; a target object storage chamber for storing the target object; and a second convey chamber, disposed between said preliminary vacuum chamber and said target object storage chamber, for conveying the target object between said preliminary vacuum chamber and said target object storage chamber;

exhaust means for exhausting the cleaning gas from at least one of each of said vacuum processing chambers, said vacuum convey chamber, said preliminary vacuum chamber, said object storing chamber, and said second convey chamber; and concentration detection means for detecting Cl and F concentrations in the gas after cleaning using the cleaning gas.

2. An apparatus according to claim 1, wherein said cleaning gas supply means supplies the cleaning gas from at least one of said vacuum processing chambers to diffuse the cleaning gas to the convey chamber which can communicate with said vacuum processing chamber.

3. An apparatus according to claim 1, wherein said vacuum processing chambers are film formation chambers for performing a film formation process to the target object.

4. A method for cleaning a vacuum processing apparatus comprising: a plurality of vacuum processing chambers for processing a target object using a process gas; a vacuum convey chamber, connected to said plurality of vacuum processing chambers, for loading and unloading the target object into and from said processing chambers at a pressure lower than atmospheric pressure; and opening and closing means for opening and closing a path between said plurality of vacuum processing chambers and said vacuum convey chamber, said method comprising the steps of:

opening said opening and closing means;

supplying a cleaning gas containing a $ClF_3$ gas into at least one of said convey chamber and said processing chambers; and diffusing the cleaning gas into said plurality of vacuum processing chambers and said vacuum convey chamber communicating with each other by said opening and closing means.

5. A method according to claim 4, wherein said processing apparatus has a preliminary vacuum chamber connected to said convey chamber; an object storage chamber for storing the target object; a second convey chamber, arranged between said preliminary vacuum chamber and said object storage chamber, for conveying the target object between said preliminary vacuum chamber and said object storage chamber.

6. A method according to claim 4 further comprising the step of exhausting the cleaning gas from at least one of each of said vacuum processing chambers and said vacuum convey chamber.

7. A vacuum processing apparatus comprising:

a plurality of vacuum processing chambers for processing a target object using a process gas;

a vacuum convey chamber, connected to said plurality of vacuum processing chambers, for loading and unloading the target object into and from said vacuum processing chambers;

cleaning gas supply units arranged in said plurality of vacuum processing chambers and said vacuum convey chamber, respectively;

exhaust units arranged in said plurality of vacuum processing chambers and said vacuum convey chamber, respectively;

cleaning gas supply means for individually supplying a cleaning gas containing $ClF_3$ into said plurality of vacuum processing chambers and said vacuum convey chamber through said cleaning gas supply units;

exhaust means for individually exhausting the cleaning gas from said plurality of vacuum processing chambers and said vacuum convey chamber through said exhaust units; and concentration detection means for detecting Cl and F concentrations in the gas after completion of cleaning using the cleaning gas.

8. An apparatus according to claim 7, further comprising opening and closing means for opening and closing a path between said plurality of vacuum processing chambers and said vacuum convey chamber, and wherein the cleaning gas is supplied from said cleaning gas supply means into said plurality of vacuum processing chambers and said vacuum convey chamber through said cleaning gas supply units in a closed state of said opening and closing means.

9. An apparatus according to claim 7, further comprising: a preliminary vacuum chamber connected to said vacuum convey chamber; an object storage chamber for storing the target object; and a second convey chamber, arranged between said preliminary vacuum chamber and said object storage chamber, for conveying the target object between said preliminary vacuum chamber and said object storage chamber.

10. An apparatus according to claim 7, wherein said vacuum processing chambers are film formation chambers for performing a film formation process to the target object.

11. A method for cleaning a processing apparatus comprising a plurality of processing chambers for processing a target object using a process gas; a convey chamber, connected to said plurality of processing chambers, for loading and unloading the target object into and from said processing chambers; and opening and closing means for opening and closing a path between said plurality of process chambers and said convey chamber, said method comprising the steps of:

opening said opening and closing means; and individually supplying a cleaning gas containing $ClF_3$ into said plurality of processing chambers and said convey chamber, wherein said plurality of processing chambers and said convey chamber are individually cleaned with the cleaning gas.

12. A method according to claim 11, wherein said vacuum processing apparatus has a preliminary vacuum chamber connected to said convey chamber; an object storage chamber for storing the target object; a second convey chamber, arranged between said preliminary vacuum chamber and said object storage chamber, for conveying the target object between said preliminary vacuum chamber and said object storage chamber.

13. A method according to claim 11, further comprising the step of exhausting the cleaning gas from at least one of each of said vacuum processing chambers and said vacuum convey chamber.

14. A method for cleaning a vacuum processing apparatus comprising: a plurality of vacuum processing chambers for processing a target object using a process gas; a vacuum convey chamber, connected to said plurality of vacuum processing chambers, for loading and unloading the target object into and from said processing chambers; and opening and closing means for opening and closing a path between said plurality of vacuum processing chambers and said vacuum convey chamber, said method comprising the steps of:

separating said plurality of vacuum processing chambers and said vacuum convey chamber into a plurality of space in said vacuum processing apparatus by operating said opening and closing means; and supplying a cleaning gas containing $ClF_3$ having a concentration set in correspondence with each space into the spaces.

15. A processing method in a vacuum processing apparatus comprising: a plurality of vacuum processing chambers for processing a target object using a process gas; a vacuum convey chamber, connected to said plurality of vacuum processing chambers, for loading and unloading the target object into and from said processing chambers; and opening and closing means for opening and closing a path between said plurality of vacuum processing chambers and said vacuum convey chamber, said method comprising the steps of:

closing said opening and closing means between said vacuum convey chamber and at least one of said vacuum processing chambers;

performing a process using the process gas to the target object in at least one of said vacuum processing chambers; and supplying a cleaning gas containing $ClF_3$ into remaining chambers to clean said remaining chambers simultaneously with the step of performing the process.

16. A method for cleaning a vacuum processing apparatus comprising: a plurality of vacuum processing chambers for processing a target object using a process gas; and a vacuum convey chamber, connected to said plurality of vacuum processing chambers, for loading and unloading the target object into and from said processing chambers, said method comprising the steps of:

recognizing a number of target objects processed until cleaning must be performed in each of said vacuum processing chambers; and supplying a cleaning gas containing $ClF_3$ into said plurality of vacuum processing chambers and said vacuum convey chamber to clean said plurality of vacuum processing chambers and said vacuum convey chamber when a number of processed objects reaches the number of target objects.

17. A vacuum processing apparatus comprising:

a plurality of vacuum processing chambers for processing a target object using a process gas;

a vacuum convey chamber;

a plurality of gate means, each of said gate means being provided between a path between each of the processing chambers and the convey chamber for opening and closing the path therebetween;

means for supplying a cleaning gas into at least one of the processing chambers and the convey chamber to clean all of the chambers;

means for exhausting the cleaning gas from the at least one of the processing chambers and the convey chamber;

conveying means provided in the convey chamber for conveying the target object between the convey chamber and each of the processing chambers when the path is opened;

means for driving at least one of the gate means to open the path; and control means for controlling the driving means to drive the at least one gate means in accordance with a program so that the at least one path is opened, so that cleaning gas flows between the at least one of the process chambers and the convey chamber, the gate means between which opens.

18. An apparatus according to claim 17, wherein said process chambers are arranged around the convey chamber, and having a plurality of main process chambers and a preliminary process chamber which store the target object before the target object is conveyed to the main process chamber and which includes means for heating the target object in the preliminary chamber.

19. An apparatus according to claim 17, which further includes concentration detection means for detecting a concentration of the components in the cleaning gas after completion of cleaning using the cleaning gas, and means for allowing the exhaust means to exhaust the cleaning gas when a detection value of the concentration detection means is smaller than a set value.

20. An apparatus according to claim 17, which further includes means for allowing the cleaning gas supplying means to start a supply of the cleaning gas into the chambers when a number of target objects are processed and conveyed to the outside of the processing chambers and the convey chamber.

21. An apparatus according to claim 17, wherein said control means drives the selected at least one gate means but not all, in accordance with a program, so that the selected at least one path but not all is opened.

22. An apparatus according to claim 21, wherein said cleaning gas supply means supplies the cleaning gases at the different concentration in at least one process chamber and non-selected chamber.

23. An apparatus according to claim 21, wherein said control means drives all of the gate means in accordance with a program so that all paths are opened, and said cleaning gas supply means supplies the cleaning gas into at least one of the processing and convey chambers but not all.

* * * * *